(12) United States Patent
Shitara et al.

(10) Patent No.: US 6,434,103 B1
(45) Date of Patent: Aug. 13, 2002

(54) RECORDING MEDIUM, RECORDING APPARATUS, RECORDING METHOD, EDITING APPARATUS AND EDITING METHOD

(75) Inventors: Teruyuki Shitara; Eiichi Yamada, both of Tokyo; Teppei Yokota, Chiba; Nobuyuki Kihara, Tokyo, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/578,390

(22) Filed: May 25, 2000

(30) Foreign Application Priority Data

May 25, 1999 (JP) ............................................. 11-144957

(51) Int. Cl.[7] ............................................. G11B 27/00
(52) U.S. Cl. .................. 369/83; 369/47.13; 369/30.07; 369/53.44; 369/30.05
(58) Field of Search ............................... 369/83, 30.01, 369/30.04, 30.05, 30.07, 30.09, 30.19, 47.12, 47.13, 47.14, 53.21, 53.31, 53.35, 53.44; 711/100, 200

(56) References Cited

U.S. PATENT DOCUMENTS

| | | | | |
|---|---|---|---|---|
| 5,687,397 A | * | 11/1997 | Ohmori | 369/53.21 |
| 5,805,550 A | * | 9/1998 | Ohmori | 369/53.21 |
| 5,897,652 A | * | 4/1999 | Maeda | 711/100 |
| 6,052,346 A | * | 4/2000 | Arataki et al. | 369/30.09 |
| 6,088,304 A | * | 7/2000 | Aramaki et al. | 369/83 |
| 6,249,641 B1 | * | 6/2001 | Yokota | 386/96 |
| 6,301,203 B1 | * | 10/2001 | Maeda et al. | 369/30.1 |

* cited by examiner

*Primary Examiner*—Thang V. Tran
(74) *Attorney, Agent, or Firm*—Jay H. Maioli

(57) ABSTRACT

A method and apparatus to simplify work to edit sub data by: recording one or a plurality of main data, recording management data for controlling the main data, recording one or a plurality of sub data related to the main data and sub management data for controlling the sub data on a recording medium; and linking the sub data and the sub management data so that they can be referenced from the management data.

17 Claims, 26 Drawing Sheets

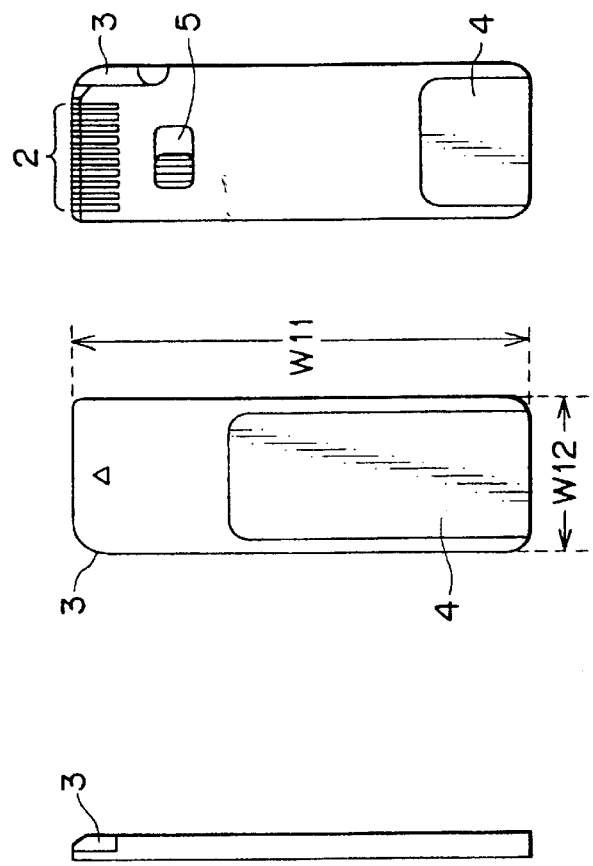

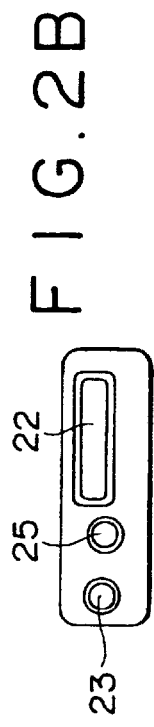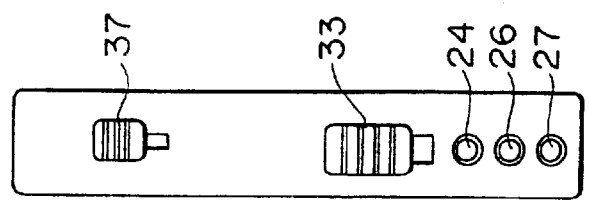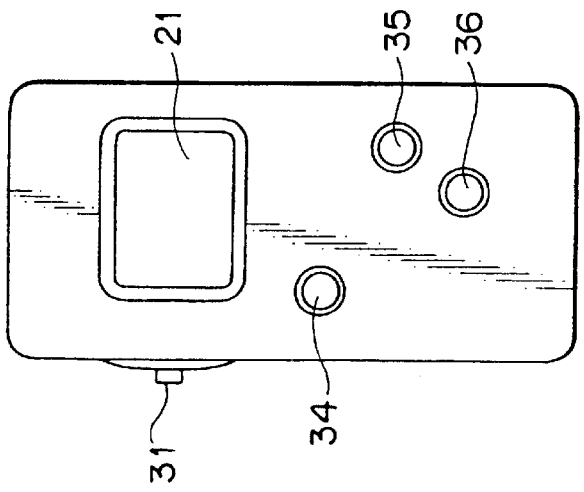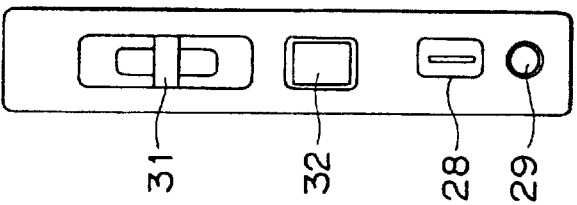
FIG.2B  FIG.2D  FIG.2A  FIG.2C  FIG.2E

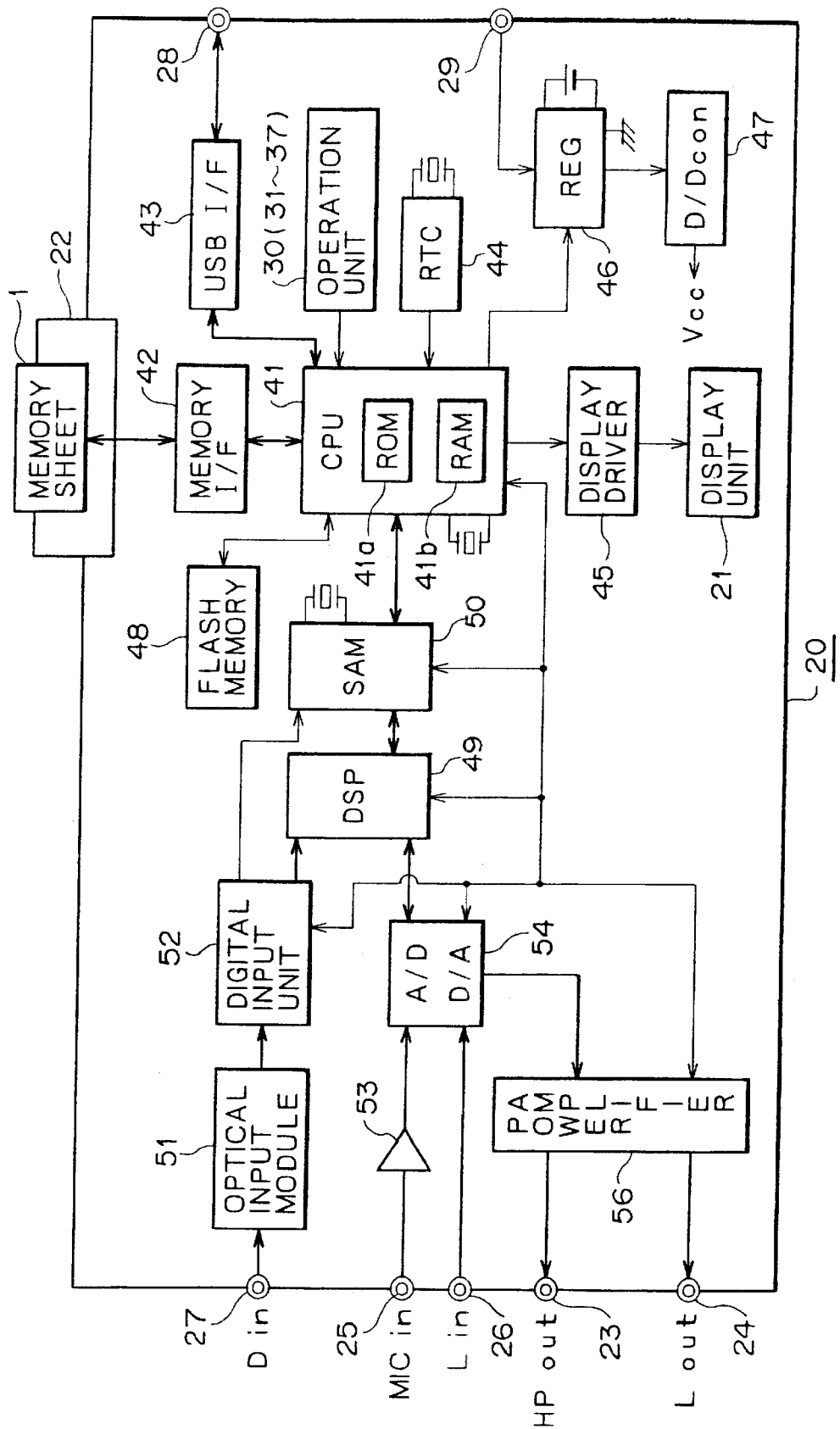

FILE-SYSTEM PROCESSING HIERARCHY

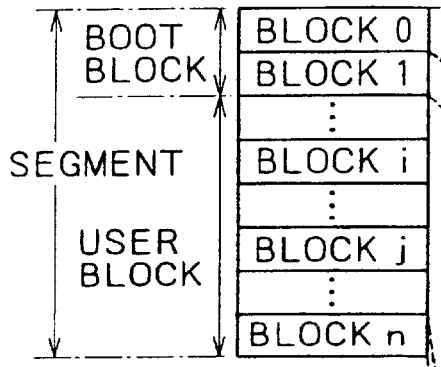
FIG. 6A
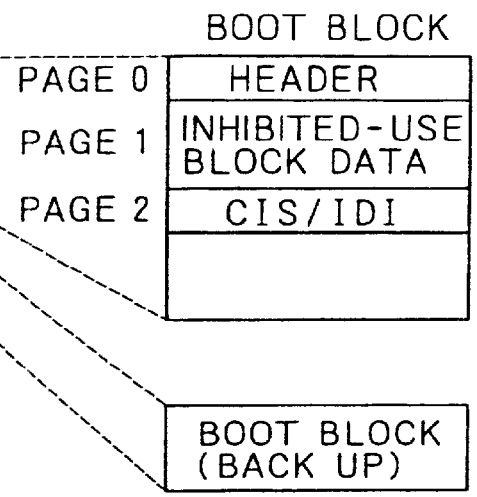
FIG. 6E
FIG. 6B
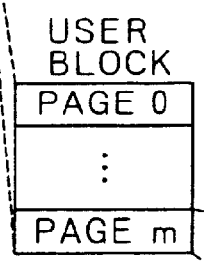
FIG. 6F
FIG. 6C
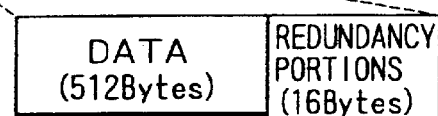
FIG. 6D
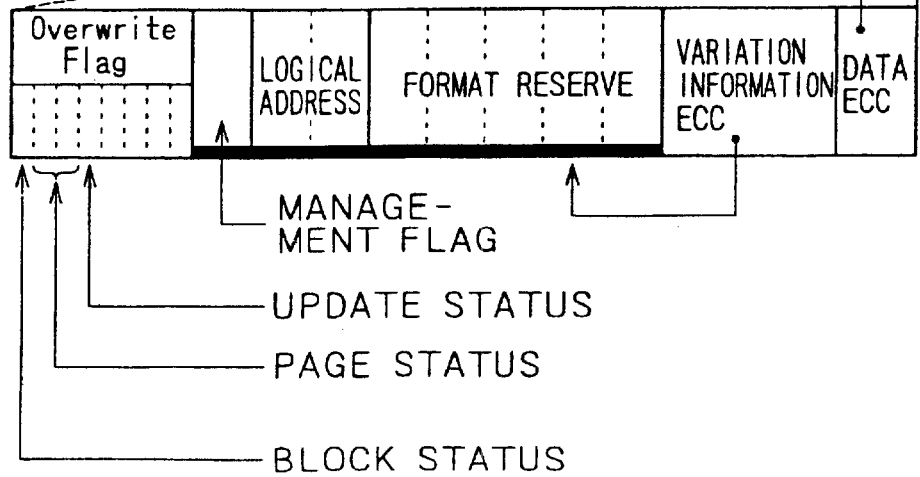

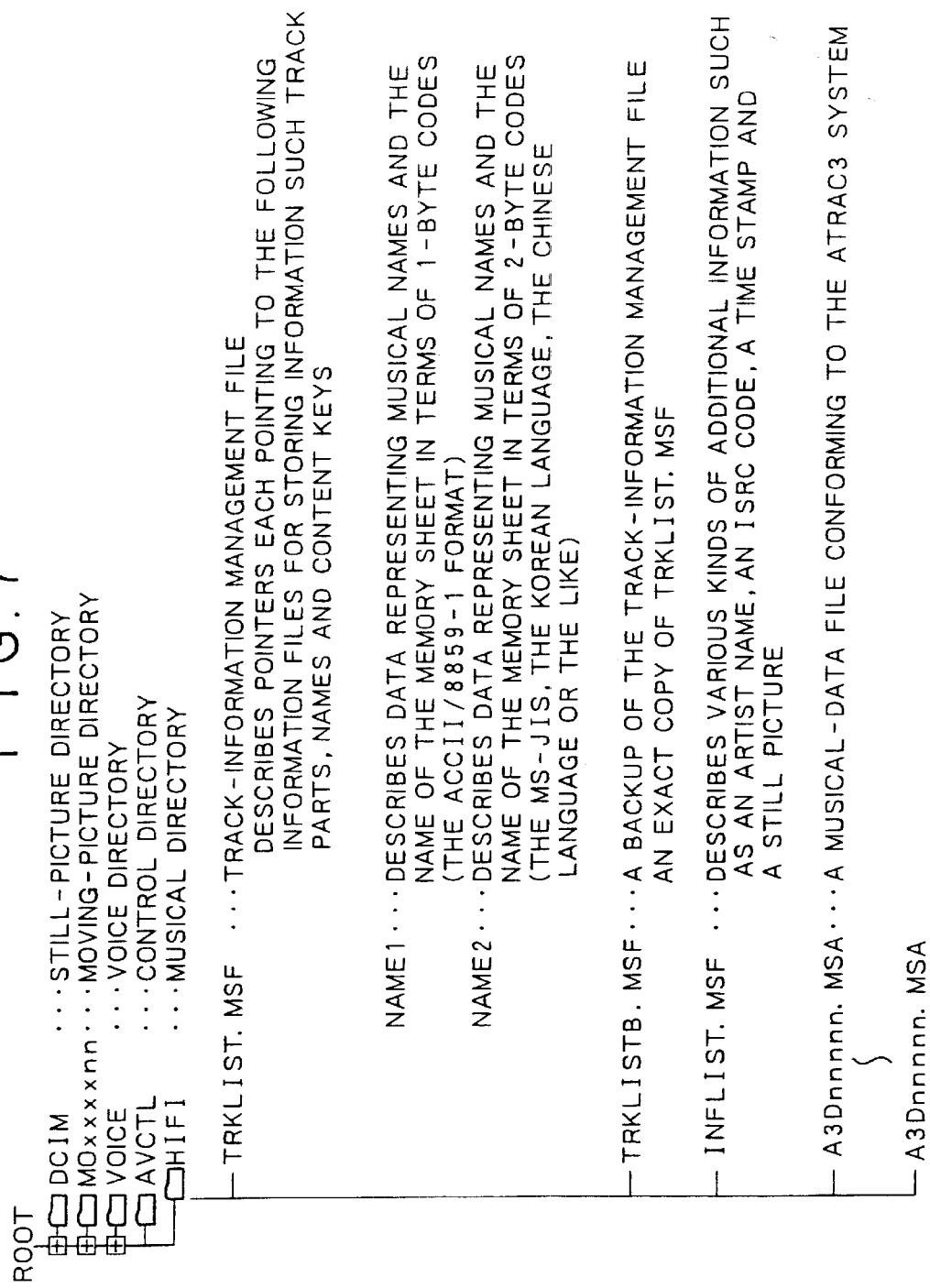

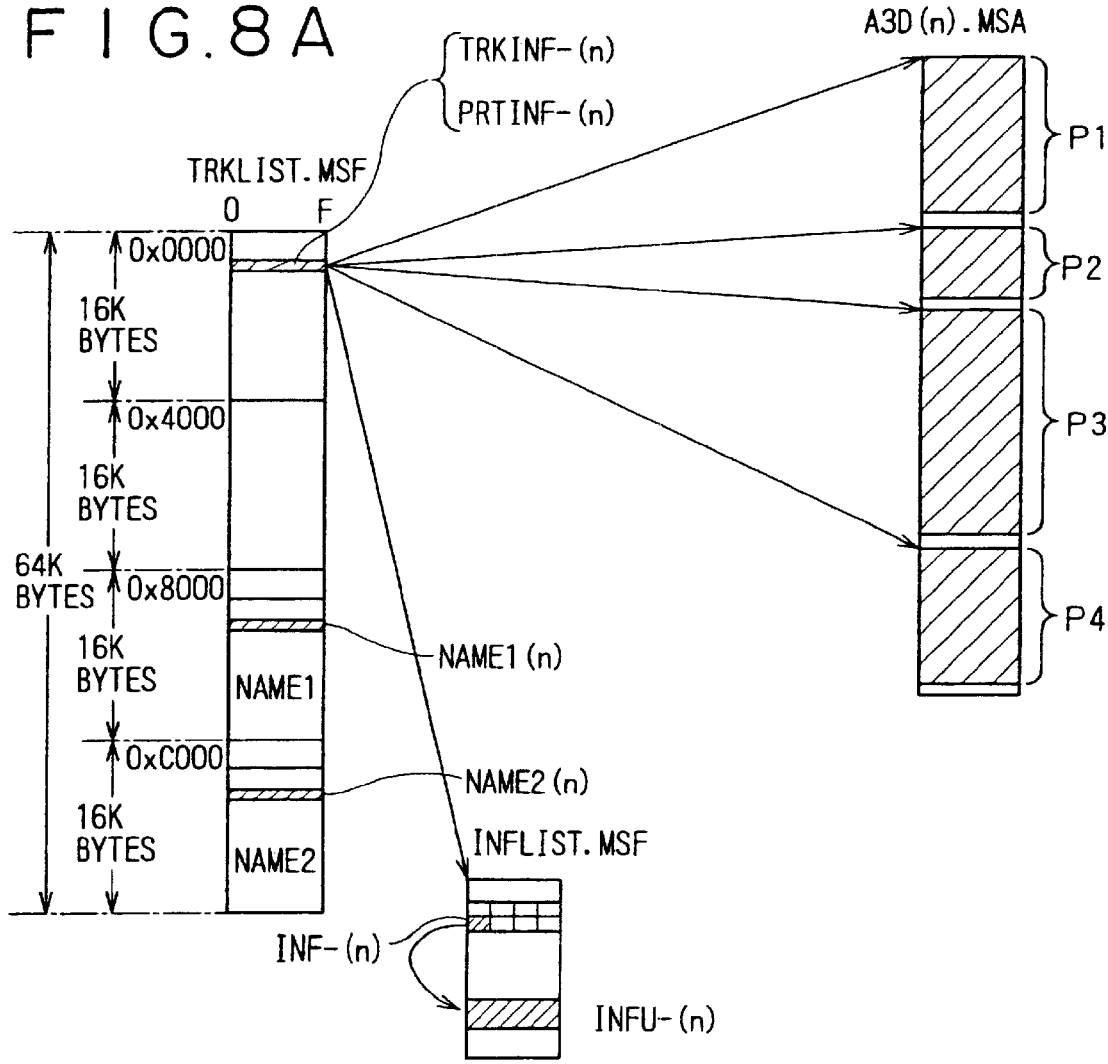

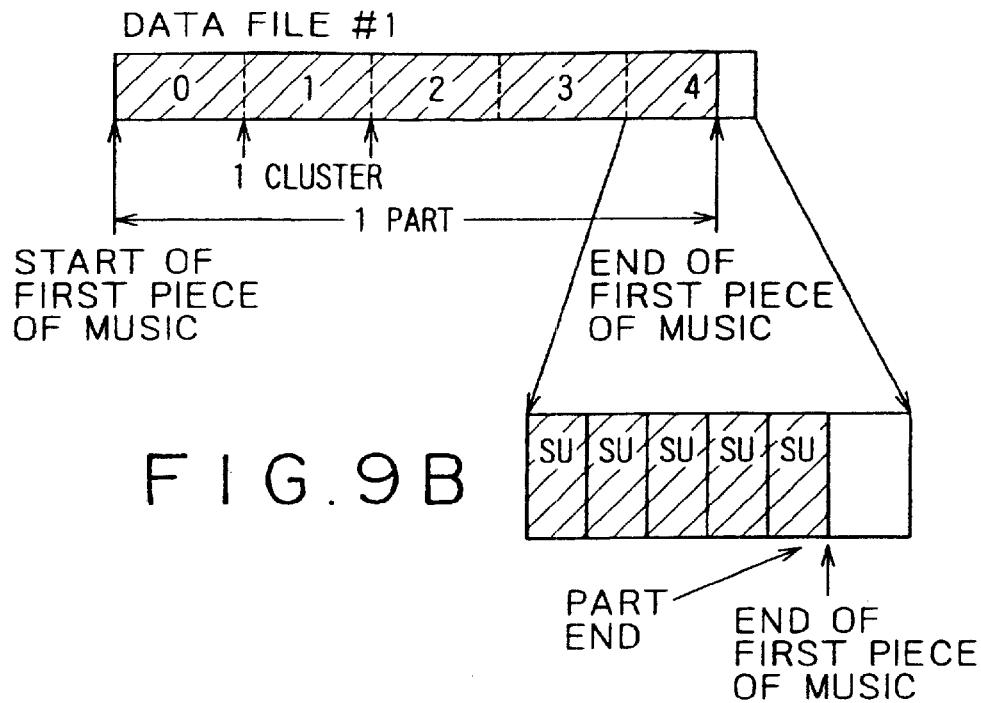
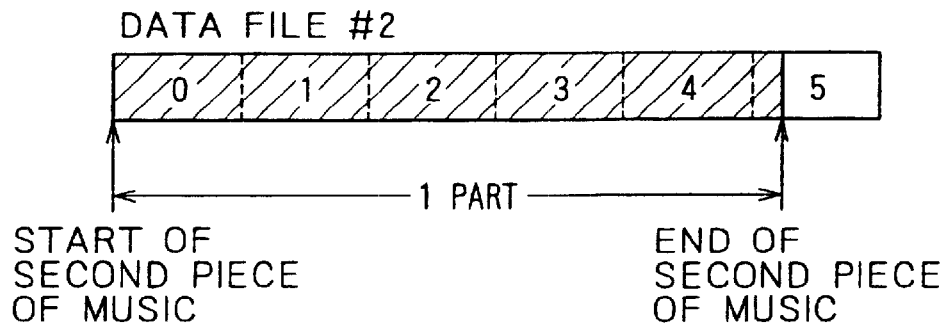

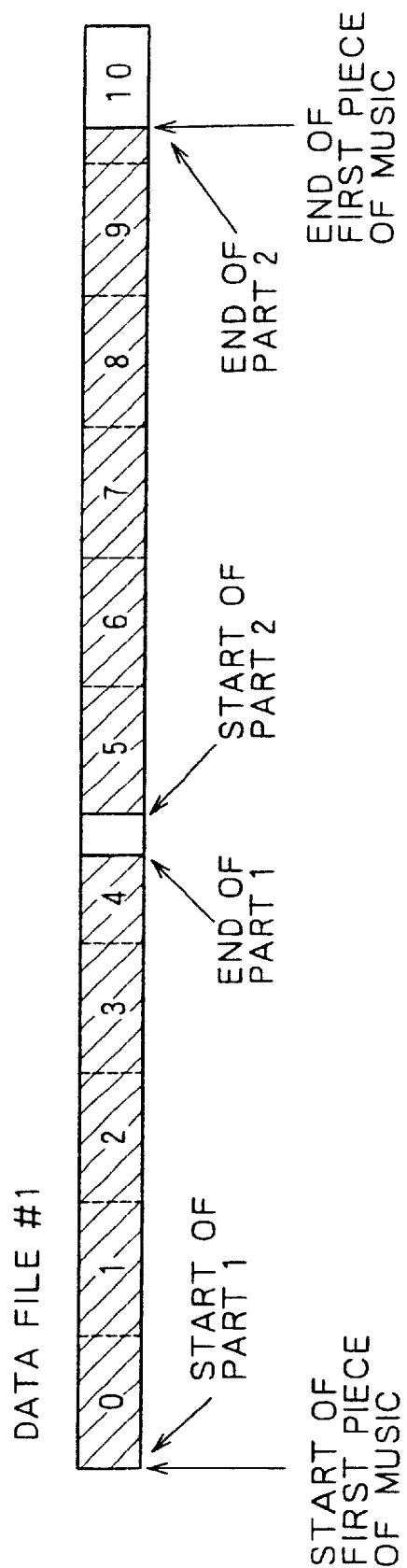

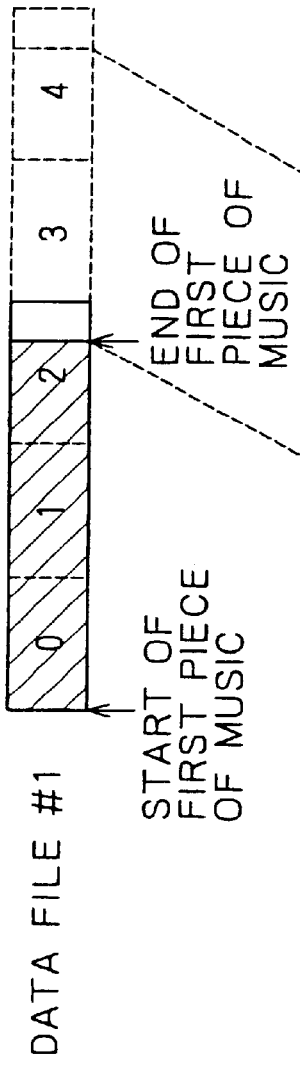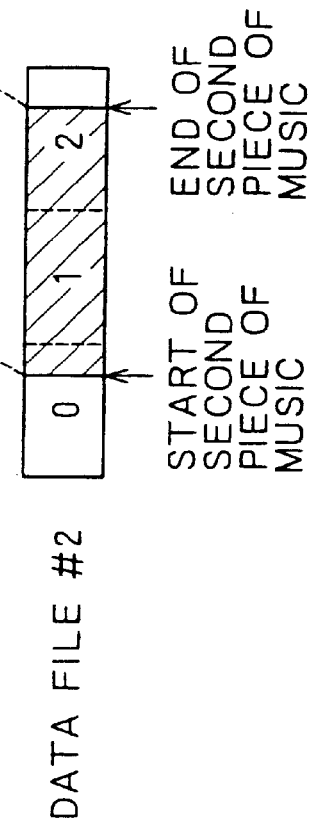

FIG.13

LOW-ORDER BYTE OF A-nnnn INFORMATION (PRTINF-nnn)

| Bit7 | COMPRESSION MODE | 1:Dual | | 1:Joint | |
|---|---|---|---|---|---|
| Bit6 | CHANNEL | 0:STEREO | | 1:MONORAL | |
| Bits 5 TO 0 | MODE INFORMATION | n MODE | TIME (BYTE COUNT) | TRANSFER RATE | COMPRE- SSIBILITY |
| | | 63:HQ | 47min (512) | 176kbps | 1/8 |
| | | 47:SP | 64min (384) | 132kbps | 1/11 |
| | | 39:CD | 78min (320) | 110kbps | 1/13 |
| | | 31:LP1 | 96min (256) | 88kbps | 1/16 |
| | | 23:LP2 | 130min (192) | 66kbps | 1/21 |
| | | 16:MONO | 184min (136) | 47kbps | 1/30 |
| | | (CODES OTHER THAN WHAT IS DESCRIBED ABOVE ARE RESERVED) | | | |

FIG. 14

HIGH-ORDER BYTE OF A-nnnn INFORMATION (PRTINF-nnnn)

| | | | |
|---|---|---|---|
| bit 7 | WRITE INHIBITED | 0:WRITABLE | 1:WRITE PROTECTED (WRITABLE FOR BUSINESSES ONLY) |
| bit 6 | COPYING PERMITTED | 0:COPYING PROHIBITED | 1:COPYING PERMITTED |
| bit 5 | GENERATIONS | 0:ORIGINAL | 1:FIRST AND SUBSEQUENT GENERATIONS |
| bits 4 AND 3 | RESERVED | | — |
| bit 2 | DATA SEGMENT | 0:AUDIO | 1:DATA SOUND SUCH AS FAX (FOR MUTING) |
| bit 1 | PLAYBACK SKIP | 0:NORMAL PLAYBACK | 1:SKIP (IN APPARATUS WITH THIS FUNCTION, NO PLAYBACK OPERATION IS CARRIED OUT |
| bit 0 | EMPHASIS | 0:off | 1:on (50/15μs) |

EXAMPLES: SCMS INFORMATION
x11: UNLIMITED COPIES
x01: COPYING PROHIBITED
x00: COPYING PERMITTED 1 TIME

FIG.15

STICK NAME AND MUSICAL-
NAME BLOCK, 1-BYTE AREA

|  | 0 | 1 | 2 | 3 | 4 | 5 | 6 | 7 | (BYTE) |
|---|---|---|---|---|---|---|---|---|---|
| 0x8000 | BLK ID-NM1 | | | | | | MCode | | |
| 0x8008 | PNM1-S | | | | PNM1-001 | | | | |
| 0x8010 | PNM1-002 | | | | PNM1-003 | | | | |
| | ≀ | | | | | | | | |
| 0x8668 | PNM1-408 | | | | NM1-S | | | | |
| | NM1-001 | | | | | | | | |
| | NM1-002 | | | | | | | | |
| | NM1-003 | | | | | | | | |
| | ≀ | | | | | | | | |
| 0xBFF0 | NM1-408 | | | | | | | | |
| 0xBFF8 | BLK ID-NM1 | | | | | | MCode | | |

FIG.16

STICK NAME AND MUSICAL-
NAME BLOCK, 2-BYTE AREA

|  | 0 | 1 | 2 | 3 | 4 | 5 | 6 | 7 | (BYTE) |
|---|---|---|---|---|---|---|---|---|---|
| 0xC000 | BLK ID-NM2 | | | | | | MCode | | |
| 0xC008 | PNM2-S | | | | PNM2-001 | | | | |
| 0xC010 | PNM2-002 | | | | PNM2-003 | | | | |
| | ≀ | | | | | | | | |
| 0xC668 | PNM2-408 | | | | NM2-S | | | | |
| | NM2-001 | | | | | | | | |
| | NM2-002 | | | | | | | | |
| | NM2-003 | | | | | | | | |
| | ≀ | | | | | | | | |
| 0xFFF0 | NM2-408 | | | | | | | | |
| 0xFFF8 | BLK ID-NM2 | | | | | | MCode | | |

FIG. 18

TYPES OF RECORDING MODE

| Mode | Nbyte | SU-nnn | Reserved (M) | Rate | min |
|------|-------|--------|--------------|------|-----|
| HQ | 512 | 31 | 512-6 | 176k | 47 |
| SP | 384 | 42 | 256-8 | 132k | 64 |
| CD | 320 | 51 | 64-6 | 110k | 78 |
| LP1_j | 256 | 63 | 256-8 | 88k | 96 |
| LP2_j | 192 | 85 | 64-6 | 66k | 130 |
| Mono | 136 | 120 | 64-6 | 47k | 184 |

DATA OF ADDITIONAL-INFORMATION UNIT

FIG. 21

EXAMPLE OF ADDITIONAL INFORMATION
TYPE SIZE                    DESCRIPTION

8 BYTES    TOC-ID. 7bits/digit. (1+7×9) BINARY DISPLAY
                 FIRST MUSICAL NUMBER, LAST MUSICAL NUMBER AND NUMBER OF THIS MUSIC
                 TOTAL PERFORMANCE TIME (msf) AND PERFORMANCE TIME OF THIS MUSIC (msf)
                 ISRC CODE (58bits (6×5+ 4×7→ 32+32))

8 BYTES    ISRC (International Standard Recording Code) COPYRIGHT CODE
                 12 DIGITS, 58 BITS (6×5+2, 4×7+6)
                 12 DIGITS 11 TO 112
                 11 TO 12 COUNTRY CODE
                 13 TO 15 OWNER CODE 11 TO 15: 6 bit format × 5+2 bit Zero
                 16 TO 17 RECORDING YEAR
                 18 TO 112 SERIAL NUMBER 16 TO 112: 4 bit BCD× 7 +6 bit Zero 7BYTES     UPC/EAN/JAN CODE 52 bits (4×13→ 8×7)

VARIABLE   EMD RELATED INFORMATION 1
    VARIABLE   EMD RELATED INFORMATION 2

MUSICAL INFORMATION (CHARACTER CODE APPENDED TO 2 START BYTES OF DATA)
    VARIABLE   LIBRETTO WRITER NAME
    VARIABLE   SONG WRITER NAME
    VARIABLE   DISC INFORMATION URL
    VARIABLE   PATH TO LIBRETTO DATA
    VARIABLE   PATH TO PICTURE DATA
    VARIABLE   PATH TO MIDI DATA
    VARIABLE   PATH TO EXPLANATORY DATA
    VARIABLE   COMMENT
    VARIABLE   PATH TO CM DATA
    2 BYTES    GENRE CODE
    VARIABLE   ALBUM NAME
    VARIABLE   ARTIST NAME/GROUP NAME

HARD CONTROL INFORMATION
    1 BYTE     AVERAGE VOLUME
    2 BYTES    NUMBER OF PLAYBACK TIMES (NUMBER OF EXECUTIONS/NUMBER OF SPECIFICATIONS)
                 FOR LEARNING PURPOSES
    VARIABLE   TRANSMITTED MESSAGE
    VARIABLE   RECEIVED MESSAGE
    4 BYTES    PLAYBACK LOG DATA YEAR MONTH DAY HOUR MINUTE SECOND (YMDhms)
    4 BYTES    PLAYBACK RESUME POINTER (1-BYTE FUNCTION, 2-BYTE CLUSTER AND 1-BYTE SU)
    VARIABLE(16) GPS POSITION INFORMATION (PLAYBACK)
    VARIABLE(16) GPS POSITION INFORMATION (RECORDING)
    VARIABLE   PASSWORD 1
    VARIABLE   PASSWORD 2
    VARIABLE   PATH TO CONTROL DATA
    4 BYTES    RECORDING TIME STAMP (YMDhms) WITH 2-SECOND RESOLUTION
    4 BYTES    SUBTRACK (SEQUENCE NUMBER (2) AND SU (4)). THE SAME DESCRIPTION AS INX

FIG. 22

DATA STRUCTURE OF ADDITIONAL-INFORMATION UNIT

| 0 | 1 | 2 | 3 | 4 | 5 | 6 | 7 | 8 | 9 | A | B | C | D | E | F |
|---|---|---|---|---|---|---|---|---|---|---|---|---|---|---|---|
| IN | ID | SID | 00 | SIZE | | MCode | | DATA-n | | | | | | | |

FIG. 23

TYPICAL DATA STRUCTURE OF ADDITIONAL INFORMATION (TIME STAMP)

| 0 | 1 | 2 | 3 | 4 | 5 | 6 | 7 | 8 | 9 | A | B | C | D | E | F |
|---|---|---|---|---|---|---|---|---|---|---|---|---|---|---|---|
| 96 | | | | 00 | 01 | MCode | | YMD 745 | | | hms 585 | 00 | 00 | 00 | 00 |

FIG. 24

TYPICAL DATA STRUCTURE OF ADDITIONAL INFORMATION (PLAYBACK LOG FILE)

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0x01 | 96 | | | 00 | 00 | 20 | MCode | | Reserved | | | | Reserved | | | |
| 0x02 | YMDhms_1 | | | | YMDhms_2 | | | | YMDhms_3 | | | | YMDhms_4 | | | |
| 0x03 | YMDhms_5 | | | | YMDhms_6 | | | | YMDhms_7 | | | | YMDhms_8 | | | |
| | YMDhms_9 | | | | YMDhms_A | | | | YMDhms_B | | | | YMDhms_C | | | |
| | | | | | | | | | | | | | | | | |
| 0x19 | YMDhms_5D | | | | YMDhms_5E | | | | YMDhms_5F | | | | YMDhms_60 | | | |
| 0x1A | YMDhms_61 | | | | YMDhms_62 | | | | YMDhms_63 | | | | YMDhms_64 | | | |

FIG.25

TYPICAL DATA STRUCTURE OF ADDITIONAL
INFORMATION (ARTIST NAME+ISRC+TOCID)

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 96 | | | | | 00 | 02 | MCode | | C | E | L | I | N | E | | |
| D | I | N | E | 00 | 00 | 00 | 00 | 00 | 00 | 00 | 00 | 00 | 00 | 00 | 00 | |
| 96 | | | | | 00 | 01 | MCode | | ISRC Code | | | | | | | |
| 96 | | | | | 00 | 01 | MCode | | TOC-ID | | | | | | | |

FIG.26

EXAMPLE OF DELETED ADDITIONAL
INFORMATION (ARTIST NAME+ISRC+TOCID)

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 96 | | | | | 80 | 02 | MCode | | C | E | L | I | N | E | | |
| D | I | N | E | 00 | 00 | 00 | 00 | 00 | 00 | 00 | 00 | 00 | 00 | 00 | 00 | |
| 96 | | | | | 80 | 01 | MCode | | ISRC Code | | | | | | | |
| 96 | | | | | 80 | 01 | MCode | | TOC-ID | | | | | | | |

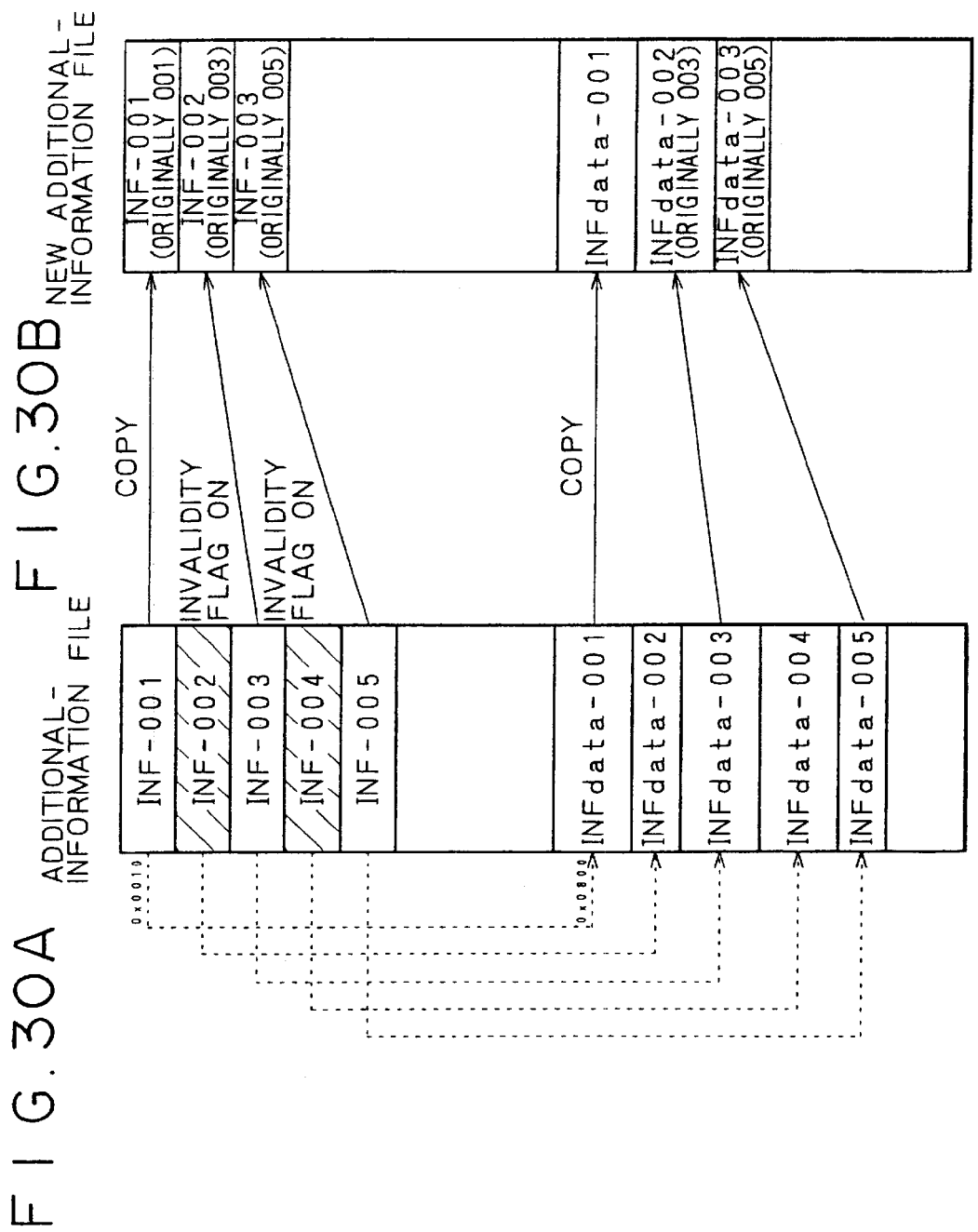

RECORDING MEDIUM, RECORDING APPARATUS, RECORDING METHOD, EDITING APPARATUS AND EDITING METHOD

BACKGROUND OF THE INVENTION

The present invention relates to a recording medium for recording one or plurality of main data, management data for controlling the main data, one or plurality of sub data related to the main data and sub management data for controlling the sub data, a recording apparatus and a recording method for recording the data into the recording medium and an editing apparatus and an editing method for carrying out editing of the sub data recorded on the recording medium.

In recent years, there have been developed audio or video apparatuses and information apparatuses for recording and playing back various kinds of data such as still-picture data, moving-picture data, musical data and audio data into and from a small-size recording medium with a solid-state recording device such as a flash memory mounted thereon by using a dedicated drive unit or a general-purpose drive unit.

With such a recording medium, recording and playback operations can be carried out for each of the apparatuses. In addition, it is expected that various kinds of data processing can be implemented in a system including an information apparatus such as a personal computer or another apparatus such as a CD player, an MD player and video visual equipment such as a video apparatus.

There is a demand for processing to edit a file stored in a storage system using such a solid-state storage device.

In addition, not only is an edit capability demanded, but there is also a demand for more efficient edit processing. In an efficient edit processing, for example, there is a demand for a minimum number of operations such as transfers, copying and rewriting of data required in file editing in a recording medium as well as a minimum edit processing time and minimum power consumption.

In particular, it is possible to conceive recording additional data into such a recording medium by associating the additional data with audio and video data. The additional data itself has a relatively large size. For this reason, there is also raised a demand for a high processing power of the processing apparatus to process additional data such as rewriting the entire additional data when it is desired to carry out editing work such as deletion of one piece of additional data.

In addition, even if such processing can be well carried out by for example an ordinary general-purpose personal computer, the processing may be too large a load for a portable recording/playback apparatus in some cases. With such a condition taken into consideration, it is desired to provide a management system which allows editing work to be carried out as a small processing load with a high degree of efficiency.

SUMMARY OF THE INVENTION

It is an object of the present invention addressing the problem described above to provide a management system for carrying out work to control and edit additional information as simple processing.

According to a first aspect of the present invention, there is provided a recording medium for recording one or plurality of main data and one or plurality of sub data related to the main data, the recording medium comprising: a main data recording region for recording the one or plurality of main data; a sub data recording region for recording at least one of sub data file comprising the one or plurality of sub data and sub management data for controlling recording locations of the sub data; and a management data recording region for recording link information for controlling the main data recorded in the main data recording region and linking the main data to the sub data file containing the sub data related to the main data.

According to a second aspect of the present invention, there is provided a method of recording data into a recording medium for recording one or plurality of main data, management data for controlling the main data and one or plurality of sub data related to the main data, the method comprising the steps of: recording the main data into the recording medium; recording the management data based on recording of the main data; recording a sub data file comprising the one or plurality of sub data into the recording medium; and updating the management data so as to record link information for linking the main data to the sub data file as one of the management data.

According to a third aspect of the present invention, there is provided an editing method for carrying out editing work by deletion of an invalid one of sub data recorded on a recording medium used for recording one or plurality of main data, management data for controlling the main data and a sub data file comprising at least one of the sub data related to the main data and sub management data for controlling the sub data wherein the sub data file is connected and linked to the management data, the editing method comprising: a data reading step of reading out the management data from the recording medium; a file reading step of reading out the sub data file from the recording medium in accordance with link information of the management data; a deletion step of deleting management data associated with sub data invalidated by sub management data in the sub data file and deleting the sub data determined to be invalid from the sub data file in case the sub data is determined to be invalid on the basis of the sub management data in the sub data file; and a file writing step of writing back the sub data file with unnecessary information deleted at the deletion step into the recording medium.

According to a fourth aspect of the present invention, there is provided an editing method for carrying out editing work by deletion of sub data recorded on a recording medium used for recording one or plurality of main data, management data for controlling the main data and a sub data file comprising at least one of the sub data related to the main data and sub management data for controlling the sub data wherein the sub data file is connected and linked to the management data, the editing method comprising: a data reading step of reading out the management data from the recording medium; a file reading step of reading out the sub data file from the recording medium in accordance with link information of the management data; a rewriting step of rewriting a specific one or plurality of sub management data associated with sub data specified to be deleted in the sub data file read out at the file reading step; and a file writing step of writing back the sub data file with the specific one or plurality of sub management data for the unnecessary sub data rewritten at the rewriting step into the recording medium.

According to a fifth aspect of the present invention, there is provided a recording apparatus for recording one or plurality of main data, management data for controlling the main data and a sub data file comprising at least one of sub data related to the main data and sub management data for controlling the sub data into a recording medium, the recording apparatus comprising: recording means for recording the main data, the management data or the sub data file into the recording medium; first updating means for updating the management data stored on the recording medium on the basis of recording of the main data into the recording medium; sub data file generation means for generating sub management data for controlling at least one of sub data and creating a sub data file comprising at least the one of sub data and the sub management data; and second updating means for updating the management data so as to record link information associating the sub data file with the main data as one of the management data.

According to a sixth aspect of the present invention, there is provided an editing apparatus for carrying out editing work by deletion of an invalid one of sub data recorded on a recording medium used for recording one or plurality of main data, management data for controlling the main data and a sub data file comprising at least one of the sub data related to the main data and sub management data for controlling the sub data wherein the sub data file is connected and linked to the management data, the editing apparatus comprising: reading means for reading out the information from the recording medium; writing means for writing the data into the recording medium; judgment means for forming a judgment as to whether or not there is an invalid one of sub data on the basis of the sub management data in the sub data file read out from the recording medium by the recording means; and control means for controlling work to edit the sub data file in case a result of the judgment formed by the judgment means indicates that there is an invalid one of sub data by execution of the steps of: deleting management data associated with sub data invalidated by the sub management data in the sub data file; deleting the sub data determined to be invalid from the sub data file; and controlling the write means to write the edited sub data file into the recording medium.

According to a seventh aspect of the present invention, there is provided an editing apparatus for carrying out editing work by deletion of sub data recorded on a recording medium used for recording one or plurality of main data, management data for controlling the main data and a sub data file comprising at least one of the sub data related to the main data and sub management data for controlling the sub data wherein the sub data file is connected and linked to the management data, the editing apparatus comprising: access means for reading out and writing the data from and into the recording medium; and control means for controlling the access means to execute the steps of: rewriting a specific one or plurality of sub management data associated with sub data specified to be deleted in the sub data file read out by the access means; and writing back the sub data file with the specific one or plurality of sub management data rewritten into the recording medium.

BRIEF DESCRIPTION OF THE DRAWINGS

FIGS. 1A through 1D are diagrams showing, respectively, a top view, a front view, a side view and a bottom view of the external appearance of a memory sheet provided by an embodiment of the present invention;

FIGS. 2A through 2E are diagrams showing, respectively, a front view, the top, the left side, the right side and the bottom of a drive apparatus provided by the embodiment;

FIG. 3 is a block diagram showing the internal configuration of the drive apparatus;

FIGS. 6A through 6F are explanatory diagrams showing the data structure of the memory sheet provided by the embodiment in which 6A showing a data unit named a segment, 6B showing user blocks, 6C showing a page, 6D showing a redundancy portion of a page, 6E showing boot blocks and 6F showing a backup block;

FIG. 7 is an explanatory diagram showing the directory structure of the memory sheet provided by the embodiment;

FIGS. 8A, 8B and 8C are explanatory diagrams showing, respectively, TRKLIST.MSF, A3D(n).MSA and INFLIST.MSF consisting the management structure of the memory sheet provided by the embodiment;

FIGS. 9A, 9B and 9C are explanatory diagrams showing data files in which 9A showing the configuration of a data file #1, 9B showing a boundary portion between parts and 9C showing the configuration of a data file #2, stored in the memory sheet provided by the embodiment;

FIG. 10 is an explanatory diagram showing an operation to combine data files stored in the memory sheet provided by the embodiment;

FIGS. 11A and 11B are explanatory diagrams of a data file #1 and a data file #2 respectively each showing an operation to divide a data file stored in the memory sheet provided by the embodiment;

FIG. 13 is an explanatory diagram showing a low-order byte of the track-information management file A-nnn provided by the embodiment;

FIG. 14 is an explanatory diagram showing a high-order byte of the track-information management file A-nnn provided by the embodiment;

FIG. 15 is an explanatory diagram showing the data structure of NAME1 of the track-information management file provided by the embodiment;

FIG. 16 is an explanatory diagram showing the data structure of NAME2 of the track-information management file provided by the embodiment;

FIG. 18 is an explanatory diagram used for describing recording modes of the memory sheet provided by the embodiment;

FIG. 21 is an explanatory diagram showing typical additional information provided by the embodiment;

FIG. 22 is an explanatory diagram showing a unit of additional information provided by the embodiment;

FIG. 23 is an explanatory diagram showing a typical unit of additional information provided by the embodiment;

FIG. 24 is an explanatory diagram showing another typical unit of additional information provided by the embodiment;

FIG. 25 is an explanatory diagram showing a further typical unit of additional information provided by the embodiment;

FIG. 26 is an explanatory diagram showing an example of a deleted unit of additional information provided by the embodiment;

FIGS. 30A and 30B are explanatory diagrams respectively showing an additional information file before and after the file compression processing provided by the embodiment.

DESCRIPTION OF THE PREFERRED EMBODIMENT

Figure 4:
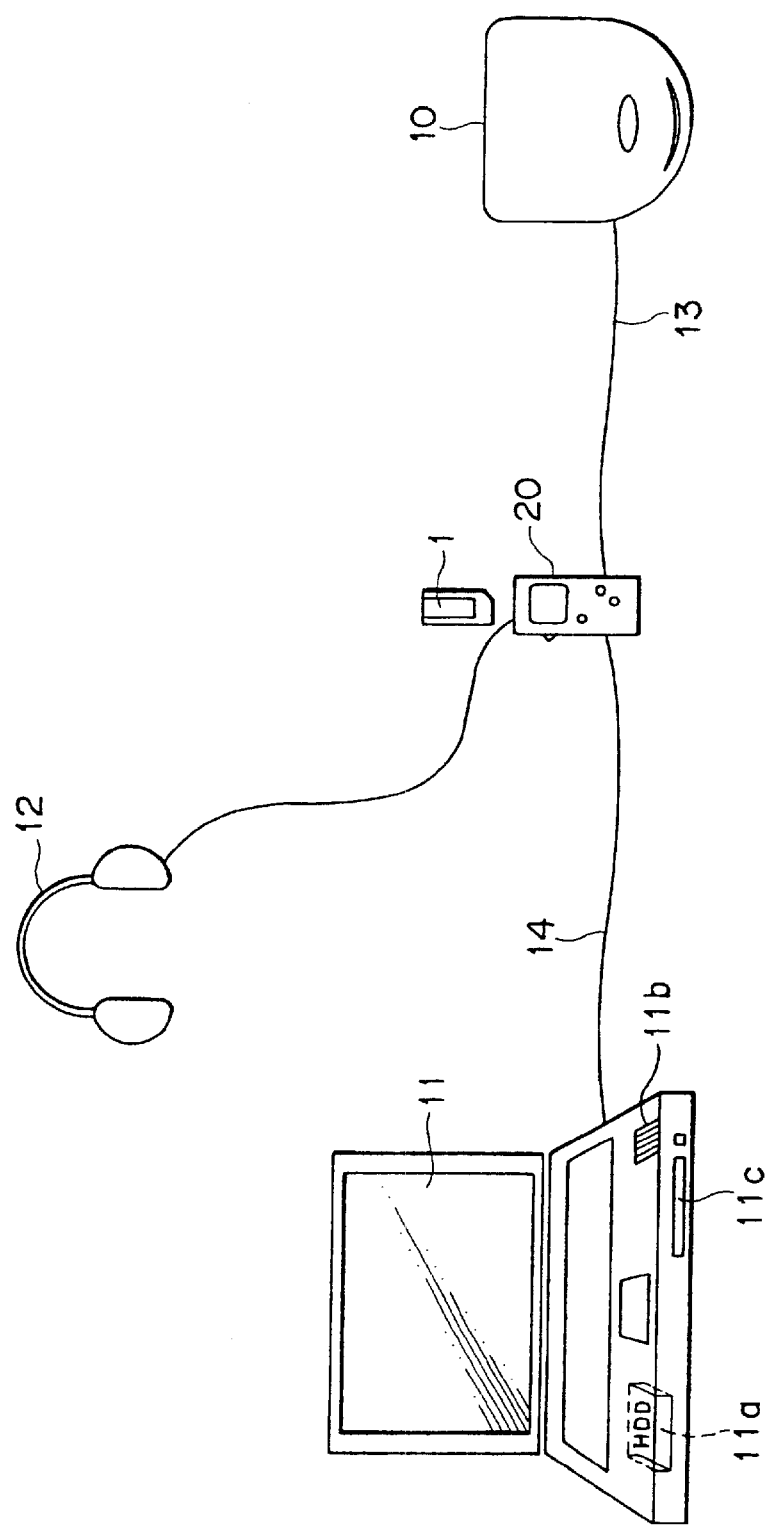
FIG. 4 is an explanatory diagram showing a typical system connection including the drive apparatus and the memory sheet provided by the embodiment.

A preferred embodiment of the present invention is described as follows. It should be noted that a recording medium provided by the embodiment, that is, a recording medium of the present invention, is exemplified by a memory sheet which is a memory having a planar external shape.

A data processing apparatus of the present invention is exemplified by a drive apparatus capable of recording and playing back data into and from the memory sheet.

A data file, a management file and an additional-information file provided by the present invention are exemplified by a data file named A3Dnnnnn.MSA, a track-information management file named TRKLIST.MSF and an additional-information file named INFLIST.MSF respectively which will be described later.

The description is presented in the following order:
1. Memory Sheet
2. Configuration of the Drive Apparatus
3. Typical System Connection
4. File System
    4-1 Processing Structure and Data Structure
    4-2 Directory Structure
    4-3 Management Structure
    4-4 Track-Information Management File (TRKLIST.MSF)
    4-5 Data Files (A3Dnnnnn.MSA)
    4-6 Additional-Information File (INFLIST.MSF)
5. File Recording Processing
6. File Deletion Processing
7. Processing to Compress the Additional-Information File

1. Memory Sheet

First of all, the external shape of a memory sheet 1 used as a recording medium provided by the embodiment is explained by referring to FIGS. 1A to 1D.

The memory sheet 1 has a memory device of typically a predetermined storage capacity accommodated in a planar case like one shown in FIGS. 1A to 1D. In this embodiment, the memory device is a flash memory.

FIGS. 1A to 1D are diagrams showing a top view, a front view, a side view and a bottom view of the case which is formed by typically a plastic mold. As shown in the figure, as an example, the case has a depth W11 of 60 mm, a width W12 of 20 mm and a thickness W13 of 2.8 mm.

On the front side of the bottom of the case, a terminal unit 2 comprising 10 electrodes is provided. Data is read out and written from and into the memory device through the terminal unit 2.

The left upper corner of the case is a cut 3 oriented in the planar direction. The cut 3 prevents the memory sheet 1 from being mounted onto a mounting/dismounting mechanism in a wrong orientation of the case when the case is inserted into the mounting/dismounting mechanism.

A label sticking surface 4 is provided over portions of the top and the bottom of the case. The user sticks a label for describing stored data on the label sticking surface 4.

A slide switch 5 is provided on the bottom. The slide switch 5 prevents recorded data from being erased inadvertently.

The storage capacity of the flash memory employed in the memory sheet 1 is prescribed to be 4 MB, 8 MB, 16 MB, 32 MB, 64 MB or 128 MB where notation MB is an abbreviation of megabytes.

The so-called FAT (File Allocation Table) system is used as a file system for recording and playing back data.

The write speed is 1,500 Kbyte/sec to 330 Kbyte/sec and the read speed is 2.45 Mbyte/sec. Data is written in units of 512 bytes and deleted in block units of 8 KB or 16 KB where notation KB is an abbreviation of kilobytes.

The power-supply voltage Vcc is 2.7 V to 3.6 V and the serial clock signal SCLK has a maximum frequency of 20 MHz.

2. Configuration of the Drive Apparatus

The configuration of the drive apparatus 20 provided by this embodiment and capable of recording and playing back data into and from the memory sheet 1 is explained by referring to FIGS. 2A to 2E and FIG. 3.

It should be noted that the drive apparatus 20 is capable of handling a number of types of main data to be written and read out into and from the memory sheet 1. Examples of the data are moving-picture data, still-picture data, voice data, audio data, musical data and control data.

In the following description, the data is assumed to be mainly audio data or musical data.

FIGS. 2A to 2E are diagrams showing respectively a front view, the top, a left-side view, a right-side view and the bottom of a typical external appearance of the drive apparatus 20.

The drive apparatus 20 is designed to have a small size and a light weight so that the user is capable of carrying the apparatus 20 with ease.

The memory sheet 1 is mounted on a mounting/dismounting mechanism 22 provided on the top side of the drive apparatus 20 as shown in FIG. 2B. Various kinds of data such as musical data, audio data, moving-picture data, still-picture data, computer data and control data are recorded and played back by the drive apparatus 20 into and from the memory sheet 1.

A display unit 21 implemented typically by a liquid crystal panel is provided on the top of the drive apparatus 20. The display unit 21 is used for displaying, among other things, a reproduced picture, information associated with a reproduced sound or a reproduced piece of music, a message serving as a guide of user operations and a menu screen for playback and edit operations.

The drive apparatus 20 also has a variety of terminals for connecting the apparatus 20 to various kinds of equipment to be described later.

For example, a headphone terminal 23 and a microphone input terminal 25 are provided on the top of the drive apparatus 20 as shown in FIG. 2B.

A headphone is connected to the headphone terminal 23. The user is capable of hearing a reproduced sound which is supplied by the drive apparatus 20 to the headphone as a playback audio signal.

A microphone is connected to the microphone input terminal 25. The drive apparatus 20 is capable of recording an input audio signal picked up by the microphone into typically the memory sheet 1.

Terminals such as a line output terminal 24, a line input terminal 26 and a digital input terminal 27 are provided on the right side of the drive apparatus 20 as shown in FIG. 2C.

A playback audio signal can be supplied to an external apparatus connected to the line output terminal 24 by an audio cable. For example, by connecting an audio amplifier to the line output terminal 24, the user is capable of hearing a piece of music or a sound played back from the memory sheet 1 through a speaker system. As an alternative, by connecting a mini-disc recorder or a tape recorder to the line output terminal 26, it is possible to dub and record a piece of music or a sound played back from the memory sheet 1 into other media.

In addition, an external apparatus such as a CD player can be connected to the line input terminal 26. In this case, an audio signal generated by the external apparatus can be supplied to the drive apparatus 20 to be recorded typically into the memory sheet 1.

Furthermore, the drive apparatus 20 is capable of inputting digital audio data transmitted by a digital source apparatus through an optical cable connected to the digital input terminal 27. An example of the digital source apparatus is an external CD player. By connecting such an external CD player to the digital input terminal 27 by an optical cable, the so-called digital dubbing operation can be carried out.

Terminals such as a USB (Universal Serial Bus) connector 28 and a power-supply terminal 29 are provided on the left side of the drive apparatus 20 as shown in FIG. 2C.

The USB connector 28 is connected to USB equipment such as a personal computer provided with typically a USB interface. In this case, the drive apparatus 20 is capable of carrying out various kinds of communication and data transmission with the USB equipment.

The drive apparatus 20 provided by this embodiment employs a dry battery or a rechargeable battery embedded therein to serve as a power supply driving the operation of the drive apparatus 20. However, the power-supply terminal 29 can be connected by a power-supply adapter to a commercial alternating-current power supply for providing power to the operation of the drive apparatus 20.

It should be noted that the types of these terminals, the number of terminals and their positions described above are typical to the bitter end. That is to say, as many terminals of other types as required can be provided at positions different from those described above.

For example, a digital output terminal for an optical cable can be provided. Another example is the use of an SCSI (Small Computer System Interface) connector, a serial port, an RS232C connector, an IEEE 1394 (Institute of Electrical and Electronic Engineers 1394) connector or another connector.

Since the structures of the terminals are already commonly known, their description is omitted. As an alternative structure, however, a single terminal can serve as the headphone terminal 23 and the line output terminal 24 or even also to serve as a digital output terminal.

By the same token, the microphone input terminal 25, the line input terminal 26 and the digital input terminal 27 can be implemented by a common single terminal.

Operators provided on the drive apparatus 20 to be operated by the user include an operation lever 31, a halt key 32, a recording key 33, a menu key 34, a volume-up key 35, a volume-down key 36 and a hold key 37.

The operation lever 31 is an operator that can be swung at least in the upward and downward directions. Typically, the operation lever 31 can also be pressed. By operating the operation lever 31, it is possible to carry out an operation to play back musical data or the like, a REW and AMS (Auto Music Search) operation, a FF and AMS operation or another operation. The REW and AMS operation is a fast-rewind and header-search operation whereas the FF and AMS operation is a fast-feed and header-search operation.

The halt key 32 is a key requesting that an operation to play back or record musical data or the like be halted.

The recording key 33 is a key making a request for an operation to record musical data or the like.

A menu key 34 is a key operated to edit musical data or the like or to set a mode. In an edit mode, an actual edit operation can be carried out by operating the operation lever 31 or carried out as an enter operation using this menu key 34.

The volume-up key 35 and the volume-down key 36 are keys respectively to increase and reduce the volume of an output of an operation to play back musical data.

The hold key 37 is a key for validating or invalidating the operating function of the other keys. When a key is pressed incorrectly while the drive apparatus 20 is being carried, for example, it is feared that a malfunction occurs. In this case, the hold key 37 is operated to invalidate the operating functions of the other keys.

The keys described above is of course no more than examples. In addition, the drive apparatus 20 can have other keys such as a cursor move key, numeric keys and an operation dial or a jog dial.

A key for turning the power supply on and off is not shown. However, an operation carried out on the operation lever 31 to make a request for a playback operation can also interpreted as an operation to turn on the power supply. On the other hand, the power supply can be turned off automatically after a predetermined time has lapsed since an operation carried out on the halt key 32. If such a scheme is implemented, a power-supply key is not required. Of course, a power-supply key can be provided.

The number of provided operators, the types of the operators and the positions of the operators may conceivably vary in many ways. By providing the operators shown in FIGS. 2A to 2E as an irreducible minimum, however, the number of keys, the size of the drive apparatus 20 and the cost can be reduced and, in addition, the operatability can be improved.

FIG. 3 is a block diagram showing the internal configuration of the drive apparatus 20.

A CPU 41 serves as a central control unit of the drive apparatus 20, controlling other components as described below.

The CPU 41 includes an embedded ROM 41a for storing an operating program and a variety of constants and an embedded RAM 41b used as a work area.

An operation unit 30 corresponds to the operators 31 to 37 described above. The CPU 41 carries out control operations prescribed by the operating program in accordance with information on an operation input received from the operation unit 30.

A flash memory 48 is also provided. The CPU 41 is allowed to store system setting information and terminal key data in the flash memory 48. The system setting information is information on a variety of operations such as a music recording mode, a playback volume and a display mode. The terminal key data is used in processing to encrypt and decrypt or decode data.

A real-time clock 44 serves as the so-called time unit for generating the present time of the day. The CPU 41 is capable of verifying the present time of the day from data representing a date and a time from the real-time clock 44.

A USB interface 43 is a communication interface with an external apparatus connected to the USB connector 28. The CPU 41 is thus capable of exchanging data with an external apparatus such as a personal computer through the USB interface 43. Examples of data exchanged with an external apparatus are control data, computer data, picture data and audio data.

A regulator 46 and a DC/DC converter 47 serve as a power-supply unit. The CPU 41 turns on a power supply by issuing a power-supply-on request to the regulator 46. Receiving the request, the regulator 46 starts receiving power from a battery. If an AC adapter is connected to the power-supply terminal 29, the regulator 29 rectifies and smoothens a supplied alternating-current voltage.

A power-supply voltage generated by the regulator 46 is converted by the DC/DC converter 47 into a voltage of a required level which is supplied to each block as an operating power-supply voltage Vcc.

The CPU 41 is capable of making an access to the memory sheet 1 mounted on the mounting/dismounting mechanism 22 through a memory interface 42. Thus, the CPU 41 allows operations to record, play back and edit data to be carried out.

In addition, the CPU 41 is also capable of displaying a necessary picture on the display unit 21 by controlling a display driver 45. In addition to a picture, the CPU 41 may display information such as a menu of operations shown to the user on the display unit 108, a guide or contents of a file recorded in the memory sheet 1. The CPU 41 is also capable of displaying picture data read out from the memory sheet 1. Picture data stored in the memory sheet 1 typically represents a moving or still picture.

As described above, the embodiment is provided with the digital input terminal 27, the microphone input terminal 25, the line input terminal 26, the headphone terminal 23 and the line output terminal 24 for inputting and outputting audio signals.

An audio-signal processing system for processing signals input and output through these terminals comprise a SAM (Security Application Module) 50 serving as an encryption/decryption unit, a DSP (Digital Signal Processor) 49, an A/D (analog to digital) & D/A (digital to analog) conversion unit 54 referred to hereafter simply as an ADDA conversion unit, a power amplifier 56, a microphone amplifier 53, an optical input module 51 and a digital input module 52.

The SAM 50 encrypts and decrypts (decodes) data exchanged between the CPU 41 and the DSP 49 and exchanges a terminal key and an identifier serving as an encryption key with the CPU 41. That is to say, the SAM 50 encrypts and decrypts data by using a terminal key.

It should be noted that data encrypted and decrypted by the SAM 50 includes management information and additional information in addition to actual data stored in a data file such as musical data. As will be described later, management information is data stored in a track-management information file and additional information is data stored in an additional-information file.

The DSP 49 compresses and decompresses audio data in accordance with an instruction issued by the CPU 41.

The digital input unit 52 carries out input interface processing of digital audio data input by the optical input module 51.

The ADDA conversion unit 54 carries out A/D conversion and D/A conversion of an audio signal.

These blocks input and output an audio signal as follows.

A signal supplied to the digital input terminal 27 from an external apparatus through an optical cable as digital audio data is subjected to an opto-electrical conversion process in the optical input module 51 prior to reception processing carried out by the digital input unit 52 in accordance with a transmission format. Digital audio data extracted in the reception processing is compressed by the DSP 49 and supplied to the CPU 41 to be recorded into typically the memory sheet 1. Of course, data output by the DSP 49 may be encrypted by the SAM 50 in some cases.

An input audio signal supplied by a microphone connected to the microphone input terminal 25 is amplified by the microphone amplifier 53 before being subjected to an A/D conversion process in the ADDA conversion unit 54. The result of the A/D conversion process is supplied to the DSP 49 as digital audio data. After completing compression processing in the DSP 49 and, in some cases, an encryption process in the SAM 50, the data is supplied to the CPU 41 to be recorded into typically the memory sheet 1.

On the other hand, in an operation to output audio data read out from the memory sheet 1, for example, the CPU 41 requests the DSP 49 to carry out a decompression process on the audio data and, in some cases, requests the SAM 50 to carry out a decoding process on the data. Digital audio data completing these processes is converted by the ADDA conversion unit 54 into an analog audio signal before being supplied to a power amplifier 56.

The power amplifier 56 carries out amplification processing for a signal to be output to a headphone and amplification processing for a signal to be output as a line output, outputting the amplified signals to the headphone terminal 23 and the line output terminal 24.

As will be described later, the drive apparatus 20 is capable of carrying out an encryption process in the SAM 50 on compressed audio data read out from the memory sheet 1 and audio data input from the digital input terminal 27, the microphone input terminal 25 or the line input terminal 26 and compressed by the DSP 49, and capable of supplying the compressed data to an external apparatus such as a personal computer, by way of the USB interface 43 and the USB terminal 28.

In addition, audio data input from an external apparatus connected to the USB terminal 28 can be subjected to an encryption process in the SAM 50 before being supplied back to the external apparatus connected to the USB terminal 28.

On the other hand, the drive apparatus 20 is capable of recording audio data received from an external apparatus via the USB interface 53 into the memory sheet 1 by means of the CPU 41 or, if necessary, decoding the data in the SAM 50 and decompressing it in the DSP 49 before outputting the data to the headphone terminal 23 or the line output terminal 24. In addition, the drive apparatus 20 is also capable of transmitting data to an external apparatus such as a personal computer through the USB interface 43. An example of data transmitted to such an external apparatus is received data completing a decryption process.

It should be noted that the configuration of the drive apparatus 20 shown in FIG. 3 is typical to the bitter end. That is to say, the drive apparatus 20 is not limited to such a configuration.

For example, the configuration may conceivably include an embedded speaker for outputting audio data. In this case, a signal output by the power amplifier 56 is supplied to the speaker which then outputs a sound based on the signal.

3. Typical System Connection

FIG. 4 is an explanatory diagram showing a typical system connection with the drive apparatus 20 serving as a core component.

The drive apparatus 20 can be used as a standalone component or used in a system in which the drive apparatus 20 is connected to another apparatus such as a personal computer 11 communicating with the apparatus 20.

As described above, by mounting a memory sheet 1 on the drive apparatus 20, the drive apparatus 20 is capable of functioning as a standalone component capable of recording and playing back data into and from the memory sheet 1.

With a memory sheet 1 for recording musical data mounted on the drive apparatus 20, for example, the user can enjoy reproduced music by connecting a headphone 12 as shown in FIG. 4.

As described above, an external playback apparatus such as a CD player 10 can be connected to the line input terminal 26 or the digital input terminal 27 by a cable 13. With CD player 10 connected to the drive apparatus 20, the drive apparatus 20 is capable of receiving a playback audio signal from the CD player 10 and recording the signal into the memory sheet 1.

In addition, the drive apparatus 20 is also capable of recording a sound collected by a microphone connected to the drive apparatus 20 into the memory sheet 1. The drive apparatus is also capable of supplying data to a recording apparatus such as an MD recorder connected to the drive apparatus 20 to be recorded into a recording medium mounted on the recording apparatus. It should be noted that the microphone and the recording apparatus themselves are not shown in the figure.

An information apparatus such as a personal computer 11 can be connected to the drive apparatus 20 by a USB (Universal Serial Bus) cable 14. In this case, the drive apparatus 20 is capable of recording data received from the personal computer 11 into the memory sheet 1 or transferring data played back from the memory sheet 1 to the personal computer 11 in a copy or move operation.

The destination of such a copy or move operation is typically an HDD 11a employed in the personal computer 11.

It should be noted that the figure also shows a speaker 11b and a CD-ROM drive 11c provided on the personal computer 11. In this case, the drive apparatus 20 is capable of carrying out operations in conjunction with the personal computer 11. For example, the drive apparatus 20 is capable of recording audio data received from typically the CD-ROM drive 11c into the memory sheet 1 or decoding encrypted audio data received from the CD-ROM drive 11c and transferring back a result of decoding to the personal computer 11.

In addition, the drive apparatus 20 is capable of transferring audio data to the personal computer 11 to be output as a sound from the speaker 11b.

Various kinds of equipment can be connected to the drive apparatus 20 as described above. As a result, while the drive apparatus 20 is being carried by the user, it is capable of performing recording and playback operations. In addition, by connecting the drive apparatus 20 to various kinds of equipment placed at a home or a work place, the apparatus 20 is also capable of carrying out system operations.

Furthermore, since the drive apparatus 20 provided by this embodiment has a display unit, the apparatus 20 is capable of functioning as a standalone component to play back information such as text data and picture data recorded in the memory sheet 1 and display them on the display unit. of course, information such as text data and picture data played back from the memory sheet 1 can be displayed on a monitor screen of the personal computer 11.

4. File System 4-1 Processing Structure and Data Structure

Next, a file system of this embodiment using the memory sheet 1 is explained.

Figure 5:
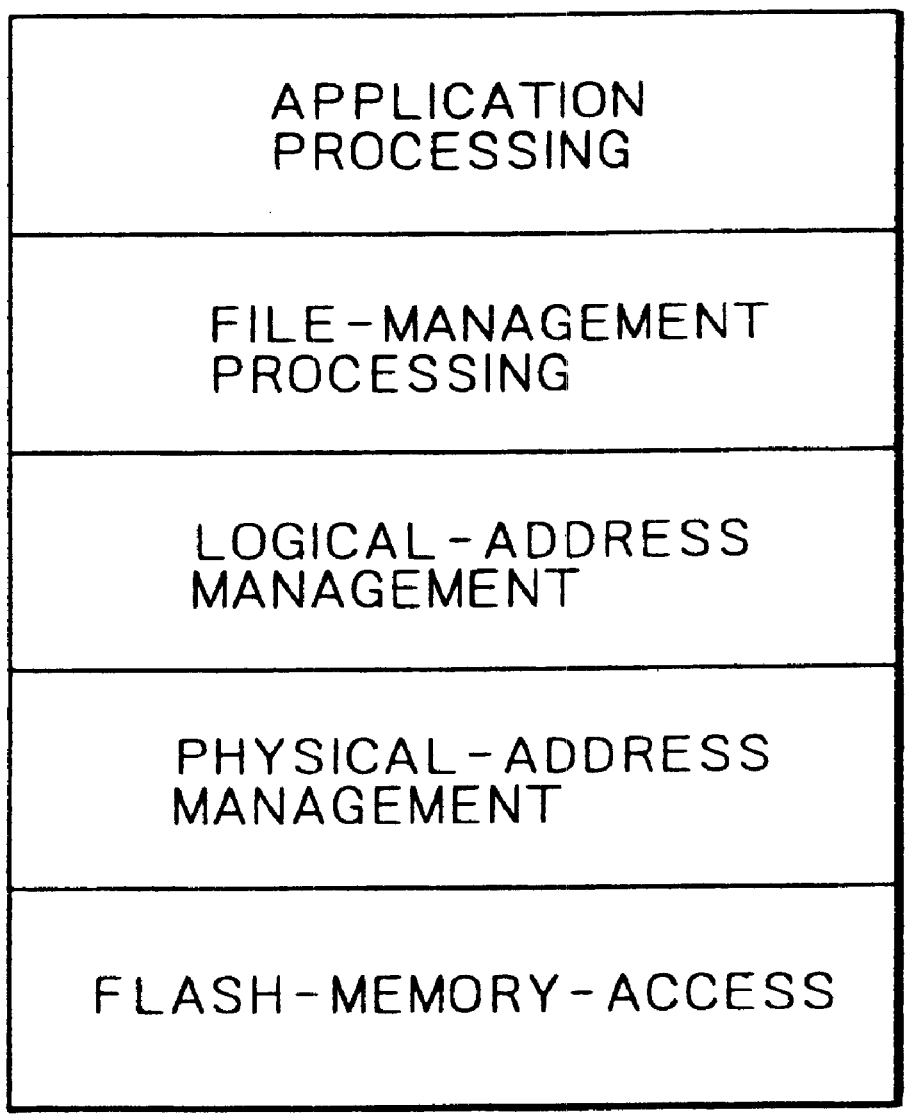
FIG. 5 is an explanatory diagram showing a file-system processing hierarchy of the memory sheet provided by the embodiment.

FIG. 5 is a diagram showing a file-system processing hierarchy of a computer system employing a memory sheet as a recording medium.

As shown in the figure, in the file-system processing hierarchy, an application processing layer is the top layer sequentially followed by a file-management processing layer, a logical-address management layer, a physical-address management layer and flash-memory-access layer. In this hierarchical structure, the file-management processing layer is a FAT (File Allocation Table) file system. A physical address is assigned to each block in a flash memory. Thus, the relation between physical addresses and blocks is fixed. A logical address is an address treated logically at the file-management processing layer.

FIGS. 6A to 6F are diagrams showing a typical physical structure of data stored in the flash memory employed in the memory sheet 1.

As shown in FIG. 6A, a data unit named a segment in the flash memory employed in the memory sheet 1 is divided into a predetermined number of blocks each having a fixed length and, as shown in FIG. 6B, each block is divided into a predetermined number of pages each having a fixed length. Data is deleted from the memory sheet 1 in block units but written and read out into and from the memory sheet 1 in page units. The blocks have a uniform size and the pages also have a uniform size as well. 1 block comprises page 0 to page m.

1 block has a typical size of 8 KB (kilobytes) or 16 KB while a typical size of a page is 512 B. In the case of a block size of 8 KB, the total storage capacity of the memory sheet 1 can be 4 MB equivalent to 512 blocks or 8 MB equivalent to 1,024 blocks. In the case of a block size of 16 KB, on the other hand, the total storage capacity of the memory sheet 1 can be 16 MB equivalent to 1,024 blocks, 32 MB equivalent to 2,048 blocks or 64 MB equivalent to 4,096 blocks.

As shown in FIG. 6C, 1 page comprises a data portion with a size of 512 bytes and a redundancy portion with a size of 16 bytes. The structure of the redundancy portion is shown in FIG. 6D. In the first place, an overwrite portion with a size of 3 bytes is used as the header of the redundancy portion. The overwrite portion is an area which can be rewritten in accordance with an operation to update data. The 3 bytes of the overwrite portion are respectively block status, page status and updating status arranged in a sequential order starting from the beginning.

As a rule, data of the remaining 13 bytes in the redundancy portion is fixed in dependence on the substance of the data portion. The 13 bytes are management flags of 1 byte, a logical address of 2 bytes, a format reserve area of 5 bytes, variance information ECC (Error Correction Code) of 2 bytes and data ECC of 3 bytes. The variance information ECC is redundant data for correction of errors in the management flags, the logical address and the format reserve area. On the other hand, the data ECC is redundant data for correction of errors in the 512-byte data portion shown in FIG. 6C.

The management flags are a system flag, a conversion table flag, a copy inhibit specification flag and an access permit flag. A system flag of 1 indicates a user block and a system flag of 0 indicates a boot block. A conversion table flag of 1 indicates invalid and a conversion flag of 0 indicates a table block. A copy inhibit specification flag of 1 indicates that a copy operation is permitted (OK) and a copy inhibit specification flag of 0 indicates that a copy operation is not allowed (NG). An access permit flag of 1 indicates a free access and an access permit flag of 0 indicates read protection.

As shown in FIG. 6A, 2 blocks at the beginning of a segment, namely, blocks 0 and 1, are boot blocks whereas the rest is information blocks as user blocks.

Used as a backup block, block 1 of the boot blocks shown in FIG. 6F has the same data written therein as block 0. Boot blocks are start blocks of valid blocks in the card of the memory sheet 1. Boot blocks are blocks which are accessed initially when the memory sheet 1 is mounted on the drive apparatus 20.

As shown in FIG. 6E, the first block of the boot blocks includes a header, a system entry and boot & attribute information on page 0 at the beginning of the block. On page 1, inhibited-use block data is stored whereas, on page 2, a CIS (Card Information Structure) and an IDI (Identify Drive Information) are stored.

The header of the first boot block is used for recording a boot block ID and the number of valid entries in the boot block. The system entry is used for recording a start position of the inhibited-use block data, the size of the data and the type of the data. The system entry is used for recording a start position of the CIS & IDI data, the size of the data and the type of the data. The boot & attribute information includes the type of the memory sheet 1, a block size, the number of blocks, a total block count, information indicating whether or not security is supported and data related to manufacturing of the memory sheet 1 including a manufacturing date. The type of the memory sheet 1 indicates whether the memory sheet 1 is a read-only memory, a readable and writable memory or a hybrid memory, that is, a memory exhibiting characteristics of the 2 types.

The above description explains the structure of data stored in the memory sheet 1.

By the way, an insulation film of a flash memory may deteriorate due to operations to write data into the memory. In order to solve this problem, the number of write operations is limited. It is thus necessary to prevent accesses from being made repeatedly and persistently to the same storage area or the same block. Such accesses can be avoided in an operation to update data stored in a physical address by the file system as follows. A physical address is seen by the file system of the memory sheet 1 as a logical address. Thus, an access to a logical address made by an application can be implemented by the file system as an access to a physical address determined arbitrarily by the file system. As a result, the file system is capable of updating data of a block subjected to the data updating operation and rewriting the updated data into another unused block instead of rewriting the data into the block subjected to the data updating operation. Therefore, the relation between a physical address and a logical address after the data updating operation is different from the relation between a physical address and a logical address prior to the data updating operation. The operation to rewrite the updated data into another unused block instead of rewriting the data into the block subjected to the data updating operation is referred to as swap processing. By carrying out swap processing as described above, it is possible to prevent accesses from being made repeatedly and persistently to the same block. As a result, the life of the flash memory employed as the memory sheet 1 can be prolonged.

A logical address is assigned to data when the data is written into a block. Thus, even if the block after a data updating operation is different from the block prior to the data updating operation as described above, to the FAT system, the assignment of the logical address to the data stored in the block remains unchanged and the same logical address can thus be used to correctly make an access to the data in the future. Since swap processing changes the relation between a logical address and a physical address, a logical-address/physical-address conversion table representing a relation between both addresses is required. By referring to this logical-address/physical-address conversion table, a physical address corresponding to a logical address specified by an application can be identified by the FAT system which controls the table. As a result, an access to a block at the identified physical address can be made.

The logical-address/physical-address conversion table is stored typically in the RAM 41b employed in the drive apparatus 20 but it can also be stored in the memory sheet 1.

Roughly speaking, logical addresses each having a length of 2 bytes are arranged in the logical-address/physical-address conversion table in an ascending order and a physical address also having a length of 2 bytes is assigned to each of the logical address. Since the maximum capacity of a flash memory is 128 MB (or 8,192 blocks) and a physical address is assigned to each of the blocks, 8,192 addresses are sufficient. The logical-address/physical-address conversion table is controlled for each segment and its size increases in dependence on the capacity of the memory sheet 1. Assuming that the storage capacity of the memory sheet 1 is 8 MB, or 2 segments, 2 pages are allocated to a logical-address/physical-address conversion table for each of the 2 segments.

A logical-address/physical-address conversion table can also be stored in the memory sheet 1 as mentioned above. In this case, a predetermined bit of the management flags in the redundancy portion of each page is set to indicate that a logical-address/physical-address conversion table for the page is stored in the memory sheet 1.

The memory sheet 1 provided by this embodiment can be used by means of the FAT file system of a personal computer in the same way as a disc-shaped recording medium. The memory sheet 1 includes an IPL (Initial Program Loader) area, a FAT area and a root-directory area which are not shown in FIG. 6A. The IPL area is used for recording an address of a program to be initially loaded into a memory of the drive apparatus 20 and recording various kinds of information on the memory. The FAT area is used for recording matters related to blocks or clusters. To be more specific, the FAT area is used for prescribing values representing unused blocks, the number of a next block, bad blocks and the last block. The root-directory area is used for storing directory entries including file attributes, an update date and time, a start cluster and a file size.

In this embodiment, file management information, or, to put it concretely, a track-information management file to be described later is prescribed for a musical file separately from a file management system prescribed in the format of the memory sheet 1 described above. The track-information management file is recorded in a user block of the memory sheet 1. With a recorded track-information management file, files can be recovered even if a FAT in the memory sheet 1 is destroyed.

A track-information management file is created by the CPU 41. When the power supply is turned on for the first time, for example, the CPU 41 forms a judgment as to whether or not the memory sheet 1 is mounted. If the memory sheet 1 is mounted, the memory sheet 1 is authenticated. If the memory sheet 1 is verified to be a legitimate memory sheet by the authentication, the CPU 41 reads out information from the boot block of the memory sheet 1. Then, the CPU 41 reads out the logical-address/physical-address conversion table.

Data read out by the CPU 41 is stored in the RAM 41b. Also in the case of a memory sheet 1 to be sold to the user for general applications, the FAT and the root directory are stored into the memory sheet 1 at a shipping time.

The track-information management file is created and updated for each recording operation.

That is to say, when audio data is recorded in accordance with typically an operation carried out by the user as a data file to be described later, the FAT and the track-information management file are updated after the recording operation. In an operation to update a file or, to put it concretely, each time a started operation to record audio data is completed, the FAT and the track-information management file stored in the RAM 41b are updated. Then, when the memory sheet 1 is dismounted or when the power supply is turned off, the final FAT and the final track-information management file are transferred from the RAM 41b to the memory sheet 1.

It should be noted that the FAT and the track-information management file stored in the memory sheet 1 can also be updated each time a started operation to record audio data is completed. Data of the track-information management file is updated also after edit work is completed.

In addition, in this embodiment, an additional-information file describing additional information is also created, updated and stored in the memory sheet 1. The additional-information file is created and updated in the same way as the track-information management file.

Additional information is supplied to the drive apparatus 20 by transmission from an external apparatus or by an input operation carried out by the user. The supplied additional information is stored by the CPU 41 in the memory sheet 1. The operation to record additional information will be described in detail later along with other operations.

4-2 Directory Structure

Next, the structure of files stored in the memory sheet 1 is explained.

First of all, a typical directory structure is shown in FIG. 7.

As described above, main data that can be handled by using the memory sheet 1 includes moving-picture data, still-picture data, voice data, audio data, musical data and control data. In the directory structure, a root directory has subordinate directories VOICE, DCIM, MOxxxxnn, AVCTL and HIFI. VOICE is a voice directory and DCIM is a still-picture directory. AVCTL is a control directory and HIFI is a musical directory.

Since this embodiment has been exemplified by a case of recording and playing back music or audio data, only the HIFI musical directory is explained as follows.

The HIFI musical directory includes a track-information management file TRKLIST.MSF, a backup file TRKLIST-B.MSF of the track-information management file TRKLIST.MSF, an additional-information file INFLIST-.MSF and data files A3Dnnnnn.MSA.

The data file A3Dnnnnn.MSA is a file for recording actual musical data, that is, audio data compressed in accordance with an ATRAC3 (Adaptive Transform Acoustic Coding) (trade mark) system. A data file A3Dnnnnn.MSA is used for storing a piece of music. It should be noted that, in the following description, a data file is referred to as a track.

The track-information management file TRKLIST.MSF is a management file in the musical directory and used for controlling pieces of music each stored typically in a data file as a TOC of a CD system or an MD system is used for.

The track-information management file TRKLIST.MSF includes NAME1 and NAME2. NAME1 is a block describing the name of the entire memory sheet 1 and musical names in terms of 1-byte codes. That is to say, NAME1 describes data such as musical names in terms of ASCII/8859-1 character codes. On the other hand, NAME2 is a block describing the name of the entire memory sheet 1 and musical names in terms of 2-byte codes. That is to say, NAME2 describes data such as musical names in terms of MS-JIS character codes, the Korean or Chinese language.

The additional-information file INFLIST.MSF is a file for controlling and storing additional information for the entire memory sheet 1 or data files each used for storing a piece of music, for example. To put it concretely, additional information stored in the additional-information file INFLIST-.MSF includes the name of an artist, an ISRC code, a time stamp and still-picture data.

4-3 Management Structure

FIGS. 8A to 8C are diagrams showing relations among NAME1 and NAME2 of the track-information management file TRKLIST.MSF, the data file A3Dnnnnn.MSA and the additional-information file INFLIST.MSF which are all included in the musical directory.

It should be noted that, in the description of this specification and the appended drawings, a number with a prefix 0x such as 0x0010 for example, is a number expressed in the hexadecimal format.

The track-information management file TRKLIST.MSF has a fixed total length of 64 Kbytes (=16K×4). A 32-Kbyte portion of the track-information management file TRKLIST-.MSF is used for storing parameters for controlling tracks or data files. The remaining 32-Kbyte portion is allocated to NAME1 and NAME2 described above. NAME1 and NAME2 which describe information such as musical names can be implemented by treatment separate from the track-information management file TRKLIST.MSF. In the case of a system with a small RAM capacity, however, operations can be carried out more easily by handling the track-information management file TRKLIST.MSF and the musical-name file as a single management file instead of separate files.

The data file A3Dnnnn.MSA and the additional-information file INFLIST.MSF are controlled by a track-information area TRKINF-nnnn and a part-information area PRTINF-nnnn in the track-information management file TRKLIST.MSF.

For one data file A3D (n), for example, a pointer and various kinds of other information are described in one track-information area TRKINF-(n) and one part-information area PRTINF-(n). In the example shown in FIGS. 8A to 8C, a track-information area TRKINF-(n) and a part-information area PRTINF-(n) are used for controlling a data file A3D (n) which comprises 4 parts P1 to P4.

In this case, character information such as musical names for the data file A3D (n) are described in NAME1 (n) and NAME2 (n).

As will be described in detail later, the track-information area TRKINF-(n) describes a pointer pointing to an index pointer INF-(n) in the additional-information file INFLIST-.MSF. The index pointer INF-(n) in the additional-information file INFLIST.MSF further points to an additional-information unit INFU-(n) describing the actual substance of additional information. The additional-information unit INFU-(n) is also stored in the additional-information file INFLIST.MSF.

Units of additional information each associated with a data file are controlled in accordance with the scheme described above.

It should be noted that the index pointer INF-(n) in the additional-information file INFLIST.MSF is referred to as a first pointer provided by the present invention. On the other hand, the pointer in the track-information area TRKINF-(n) pointing to the index pointer INF-(n) is referred to as a second pointer provided by the present invention.

Next, a relation between a data file and a piece of music as a track is explained by referring to FIGS. 9A to 9C.

1 track is 1 piece of music. The number of tracks that can be recorded in the memory sheet 1 is limited to a typical maximum of 400. 1 piece of music is stored in 1 data file. Data stored in a data file is audio data compressed in accordance with the ATRAC3 method. A data file is recorded in the memory sheet 1 in units each called a cluster. A typical size of a cluster unit is 16 KB. Thus, a plurality of data files are never mixed in a cluster.

A block is a minimum unit of deletion of data from the memory sheet 1. In the case of the memory sheet 1 used for recording musical data, the block has the same meaning as the cluster and 1 cluster is defined to be equal to 1 sector.

1 piece of music basically consists of 1 part. However, a piece of music obtained as a result of editing work may comprise a plurality of parts. A link between parts in a piece of music is described by a part-information area PRTINF-nnnn in the track-information management file TRKLIST-.MSF.

A part is a unit of data recorded in a continuous period of time beginning at the start of a recording operation and terminating at the end of the recording operation. Normally, 1 track consists of 1 part. There is a maximum limit on the size of a part. A relation between the number of parts and the number of tracks is defined by an equation P=2,043−4×T where notations P and T denote the number of parts and the number of tracks respectively and T has a value in the range 1 to 400. Assuming that 1 track comprises 2,039 parts, there are no enough parts that can be allocated to a second piece of music. Thus, a data file for the second piece of music can not be created.

A minimum unit of a part is a sound unit abbreviated to an SU. An SU is a minimum data unit of audio data compressed in accordance with the ATRAC3 method. That is to say, an SU is a data unit with a size of several hundreds of bytes. SUs are data units of a result of compression at a compressibility of about 1/10 of audio data of 1,024 samples (that is, 1,024×16 bits×2 channels) obtained as a result of a sampling operation at a frequency of 44.1 kHz. If converted into a time, 1 SU is equivalent to about 23 msec. Normally, 1 part comprises several thousands of SUs.

FIGS. 9A to 9C are diagrams showing a file configuration of audio data recorded as 2 consecutive pieces of music from a recording medium such as a CD.

To be more specific, FIG. 9A is a diagram showing the configuration of data file #1 for the first piece of music comprising 5 clusters and FIG. 9C is a diagram showing the configuration of data file #2 for the second piece of music which comprises 6 clusters.

Since the end of the data file for the first piece of music and the beginning of the data file for the second piece of music can not be mixed in 1 cluster between the 2 files, data file #2 is created to start with a cluster following the last cluster of data file #1. Thus, if data file #1, that is, the first piece of music ends in a middle of a cluster, the rest of the cluster contains no data or no SU shown in FIG. 9B.

The above statement also holds true of data file #2 for the second piece of music.

In the above example, data files #1 and #2 each comprise 1 part.

As work to edit data files stored in the memory sheet 1, there are prescribed 4 types of processing, namely, divide, combine, erase and move.

The divide processing is carried out to divide a piece of music into 2 portions. Thus, when divide processing is carried out, the number of musical pieces is increased by 1. In divide processing, a file is divided into 2 files from the file-system point of view, and the track-information management file TRKLIST.MSF is updated. The erase processing is carried out to delete a piece of music. The number of each musical piece following the deleted piece of music is decremented by 1. The move processing is carried out to change the order of musical pieces. The move processing can also be processing to move a piece of music from the memory sheet 1 to another medium such as a hard disc. The copy processing is carried out to duplicate an original piece of music while the move processing is processing to merely change the location of a piece of music. Thus, the move processing does not produce a duplicate.

FIG. 10 is a diagram showing a result of processing to combine 2 pieces of music, namely, data files #1 and #2, shown in FIGS. 9A to 9C. By carrying out the combine processing, data files #1 and #2 are combined into new data file #1 which now comprises 2 parts.

FIGS. 11A and 11B are diagrams showing a result of processing to divide a piece of music, that is, data file #1 shown in FIG. 9A in a middle of cluster 2.

The divide processing of data file #1 results in new data files #1 and #2. New data file #1 comprises clusters 0 and 1 and the front part of cluster 2, whereas new data file #2 comprises the rear part of cluster 2 and clusters 3 and 4.

If data stored in data files itself is also updated in the various kinds of edit processing described above, it will take time and the processing load will increase. In order to solve these problems, only the track-information management file TRKLIST.MSF of a block, or cluster, including the edit point is updated. Thus, the concept of part is introduced.

4-4 Track-Information Management File TRKLIST.MSF

A detailed configuration of the track-information management file TRKLIST.MSF is explained by referring to FIGS. 12A, 12B, 13, 14, 15 and 16 as follows.

Figure 12A:
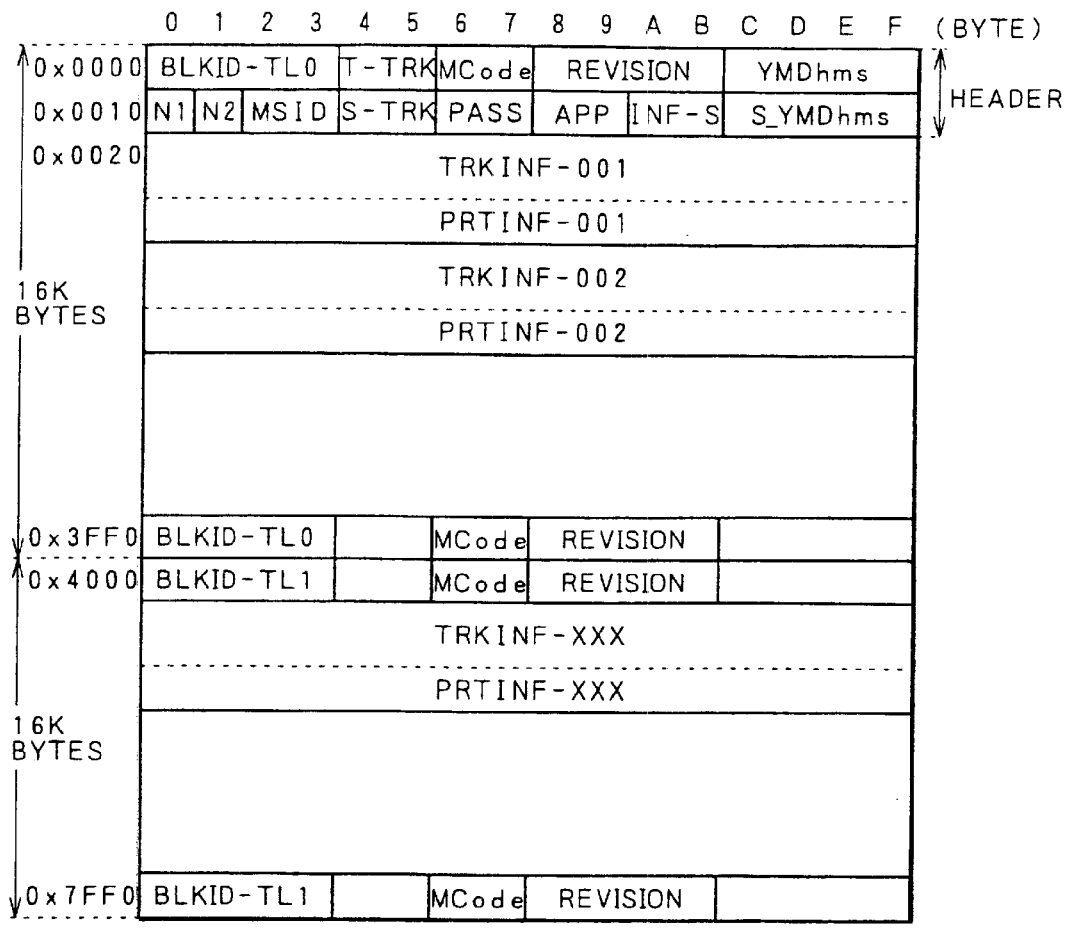
FIGS. 12A and 12B are explanatory diagrams in which 12A showing the data structure of a track-information management file stored in the memory sheet provided by the embodiment and 12B showing detailed configuration of TRKINF/PRTINF of the track-information management file.

As shown in FIGS. 8A to 8C, the track-information management file TRKLIST.MSF comprises 4 clusters or 4 blocks each having a size of 16 KB to give a total size of 64 KB. However, FIG. 12A shows only the 32-KB first half comprising the first and second clusters only.

This first-half area with a size of 32 KB is used for controlling tracks or data files.

It should be noted that, as described earlier by referring to FIG. 7, in addition to the track-information management file TRKLIST.MSF, a copy of the track-information management file TRKLIST.MSF, namely, TRKLISTB.MSF, is also created. Since the latter has the same configuration as the former, however, the explanation of the latter is omitted from the following description of the track-information management file TRKLIST.MSF.

In addition, the term slot used in the following description of each file is defined as a delimited unit of 8 or 16 bytes starting from the beginning of a file. In the case of the track-information management file TRKLIST.MSF, the size of a slot is 16 bytes. In diagrams such as those shown in FIGS. 12A, 12B, 17 and 19, a row in the horizontal direction comprises 8 or 16 bytes. Thus, such a row corresponds to a slot.

The track-information management file TRKLIST.MSF like the one shown in FIG. 12A has a 32-byte header at the beginning thereof. The header occupies slots (0x0000) and (0x0010).

The following pieces of data are sequentially arranged from the beginning of the header.

BLK ID-TL0/TL1 (4 bytes)

This data is constants TL0=0x544C2D30 and TL1=0x544C2D31.

T-TRK (2 bytes)

This data is the total number of musical pieces, having a value in the range 1 to 400.

MCode (2 bytes)

This data indicates manufacturer codes for identifying the manufacturer of the recording apparatus and the type of equipment. The codes are a control code for identifying the manufacturer of the recording apparatus used for recording data into the memory sheet 1. The codes are given when the licenser grants a license. The equipment-type code is controlled by a company granting the license.

REVISION (4 bytes)

This data is the number of times the track-information management file TRKLIST.MSF has been revised so far. The number is incremented each time a recording operation is carried out.

YMDhms (4 bytes)

This data is a date and a time on and at which the track-information management file TRKLIST.MSF was updated last.

N1 (OP) (1 byte)

This data is a numerator-side sequence number of the memory sheet 1. If only a piece is in use, the number is 0x01 for all.

It should be noted that notation OP indicates that this data is optional.

N2 (OP) (1 byte)

This data is a denominator-side sequence number of the memory sheet 1. If only a piece is in use, a number is 0x01 for all.

MSID (OP) (2 bytes)

This data is the ID of the memory sheet 1. If a plurality of sets are used, a uniform number (T. B. D.) is used as the MSID. It should be noted that the T. B. D. is an abbreviation of a phrase 'to be determined (defined) in the future'.

S-TRK (2 bytes)

This data is a description of special tracks (401 to 408) T. B. D. Normally, this data has a value of 0x0000.

PASS (OP) (2 bytes)

This data is a password T. B. D.

APP (OP) (2 bytes)

This data is a description of a playback application T. B. D. Normally, this data has a value of 0x0000.

INF-S (OP) (2 bytes)

This data is a pointer pointing to additional information with the entire memory sheet 1 treated as an object. If there is no such additional information, this pointer is set at 00.

It should be noted that the INF-S is one of pointers referred to as the second pointers of the present invention.

S_YMDhms (OP) (4 bytes)

This data is a date and a time on and at which the track-information management file TRKLIST.MSF was updated by an apparatus capable of recording a date and a time with a high degree of accuracy.

In addition to the header described above, as the last 16-byte of the first cluster of the track-information management file TRKLIST.MSF, BLK ID-TL0, MCode and REVISION which are identical with those of the header are described.

In addition, as shown in the figure, BLK ID-TL1, MCode and REVISION which are identical with those of the header are described in the first and last slots of the second cluster.

They have the following functions.

In a consumer audio apparatus, a memory sheet 1 may be pulled out or the power supply is turned off in the course of a recording operation. In such a case, it is necessary to recognize the generation of an abortion when the operation is resumed. As described above, REVISION is described at the beginning and the end of a block. Each time data of the block is updated, the value of REVISION is incremented by 1. If an abortion occurs in the course of updating a block, the value of REVISION at the beginning of the block will be different from the value of REVISION at the end of the same block. Such a difference indicates that an abortion has occurred. Since the track-information management file TRKLIST.MSF has a backup file, however, it is easy to return the track-information management file TRKLIST.MSF to an immediately preceding revision. By providing a plurality of data items for REVISION in this way, an abortion can be recognized at a high probability. It should be noted that, when an abortion is recognized, a warning such as an error message is issued.

In addition, the constants BLK ID-TL0 and BLK IDTL1 are inserted into the beginning of a 16-KB block. Thus, the constants can be used as standard references in the recovery of a destroyed FAT. That is to say, by looking at the constants described at the beginning of each block, the type of the file can be identified. Furthermore, the constants BLK ID-TL0 and BLK ID-TL1 are described at both the start and the end of a block. Thus, reliability can also be checked.

A data file for recording ATRAC3 data has a very large storage size in comparison with the track-information management file TRKLIST.MSF. For example, a data file may have a series of several thousands of blocks. With regard to a data file, a block number called BLOCK SERIAL is assigned as will be described later. It should be noted that, normally, a plurality of data files exist in the memory sheet 1. Thus, it is difficult to recover files in case the FAT is destroyed unless block numbers BLOCK SERIAL are assigned in addition to identification of contents by using content numbers CONNUMO to be described later.

By the same token, a file problem caused by wrong logic may arise even though the FAT itself is not destroyed. However, a manufacturer code MCode is described at the beginning and the end of a block so as to allow the recorded manufacturer equipment type to be identified.

In the track-information management file TRKLIST.MSF, the header is followed by a track-information area TRKINF for describing information on tracks and a part-information area PRTINF for describing information on a part in each of the tracks or pieces of music.

To put it in detail, for example, the header is followed by a track-information area TRKINF-001 and a part-information area PRTINF-001 for a track as a data file, a track-information area TRKINF-002 and a part-information area PRTINF-002 for another track and so on.

Figure 12B:
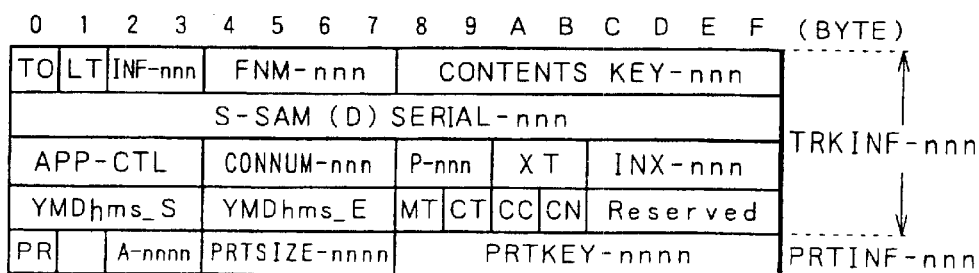

Details of the track-information area TRKINF and the part-information area PRTINF are shown in FIG. 12B. Pieces of data described therein are described sequentially as follows.

T0 (1 byte)
This data is a constant T0 of 0x74.

LT (1 byte)
This data indicates the existence or the non-existence of a playback limitation. An LT value of 0x80 indicates the existence of a playback limitation while an LT value of 0x00 indicates the non-existence of a playback limitation. Other values indicate that a playback operation is inhibited.

INF-nnn (OP) (2 bytes)
This data is a pointer pointing to additional information of the track. The pointer has a value in the range 000 to 409 specifying index pointers INF-001 to INF-409 in the additional-information file INFLIST.MSF to be described later. It should be noted, however, that the value 000 does not specify any index pointer. That is to say, a track with a pointer of 000 is not associated with additional information.

It is worth noting that INF-nnn is also a pointer referred to as a second pointer provided by the present invention.

FNM-nnn (4 bytes)
This data is a file number in the range 0x0000 to 0xFFFF assigned to a data file for storing ATRAC3 data. This data is obtained as a result of conversion of the ASCII characters nnnnn included in the data-file name A3Dnnnnn.MSA into the hexadecimal format 0xnnnnn.

CONTENTS KEY-nnn (8 bytes)
This data is a special value created for each content and encrypted in a security block of the memory sheet 1.

S-SAM (D) SERIAL-nnn (16 bytes)
This data is a serial number peculiar to an apparatus used for recording data of the memory sheet 1.

APP CTL (OP) (4 bytes)
This data is an application parameter T. B. D. Normally, it has a value of 0x0000.

CONNUM-nnn (4 bytes)
This data is a content cumulative number which is created for each content. Content cumulative numbers are kept in the security block of the recording apparatus so that no cumulative number is duplicated in one memory sheet.

P-nnn (2 bytes)
This data is the number of parts composing the piece of music (the data file). The number has a value in the range 1 to 2,039.

XT (OP) (2 bytes)
This data is a playback time (SU) starting from a pointer represented by INX described below. It should be noted that a value of 0x0000 means no setting and a value of 0xFFFF means the end of a piece of music.

INX-nnn (OP) (4 bytes)
This data is a pointer pointing to a special portion in a piece of music. The pointer is expressed in terms of SUs relative to the beginning of the piece of music. Thus, the conventional music scan function allowing the user to hear a portion of only about 10 seconds in length from the beginning of a piece of music is improved and the special portion can be specified.

YMDhms-S (4 bytes)
This data is a date and a time on and at which operations to play back a track with a playback limitation can be started. A value of 0x00000000 indicates that this data is not used.

YMDhms-E (4 bytes)
This data is a date and a time by which operations to play back a track with a playback limitation are to be ended. A value of 0x00000000 indicates that this data is not used.

MT (1 byte)
This data is the number of times the operation to play back a track with a playback limitation can be carried out. A value of 0x00 indicates that this data is not used.

CT (1 byte)
This data is the number of times the operation to play back a track with a playback limitation have been carried out. A value of 0x00 indicates that this data is not used.

CC (1 byte)
This byte data is used for copy control. To be more specific, values of 00, 01 and 10 indicate copy prohibition, copying permitted only to produce a first generation and freedom of copying respectively. It should be noted that, in the case of "the copying permitted only to produce a first generation," an operation to duplicate a copy of the produced first generation is prohibited.

CN (1 byte)
This byte data is the number of copies. A value of 00 indicates copy prohibition and a value of 0xFF indicates that an infinite number of copies up to the first generation can be produced. A value in the range 01 to 0xFE indicates the number of reproducible copies. Each time a copy is produced, a counter is incremented.

The area of 64 bytes described above is the track-information area TRKINF-nnn and the last area of 16 bytes shown in FIG. 12B is the part-information area PRTINF-nnn.

The part-information area PRTINF-nnn is used for recording pieces of information on a part which are arranged in the following order.

PR (1 byte)
This information is a constant PR of 0x50.

A-nnnn (2 bytes)
This information is attributes of the part. To be more specific, the attributes are a mode of 1 byte and an SCMS (Serial Copy Management System) information of 1 byte. Details will be described later.

PRTSIZE-nnnn (4 bytes)
This information is a 2-byte cluster size, a 1-byte start SU and a 1-byte end SU of the part.

PRTKEY-nnnn (8 bytes)
This information is a key to be used as a pair in conjunction with a content key for creating a block key for encrypting musical data. Its initial value is 0. Each time a part is generated in an edit operation, this key is incremented by 1.

The 2-byte A-nnnn described above consists of a lower-order byte and a high-order byte for recording pieces of information shown in FIGS. 13 and 14.

In the first place, the low-order byte of A-nnnn is used for prescribing mode information showing a mode of the ATRAC3 system as shown in FIG. 13.

FIG. 13 is a table showing the number of bytes in 1 SU, a recording time for a 64-MB memory sheet, a data transfer rate and a compressibility for each of 6 modes, namely, HQ, SP, CD, LP1, LP2 and mono.

Information described in the high-order byte is shown in FIG. 14. As shown in the figure, bit 0 is an emphasis bit indicating whether the emphasis function is turned on or off. Bit 1 is a playback-skip bit indicating a normal playback or a playback skip. Bit 2 is a data-segment bit representing information indicating audio data or a data sound for FAX or the like is to be generated. Bits 3 and 4 are reserved bits.

The combination of bits 5 and 6 is used to describe SCMS information as shown in the figure.

Bit 7 is a write-protected bit indicating whether a write operation is permitted or prohibited.

What is described above is an area for describing parameters for controlling a data file in the track-information management file TRKLIST.MSF.

As described above, the remaining 32-KB area of the track-information management file TRKLIST.MSF is used for describing NAME1 and NAME2.

FIG. 15 is a diagram showing a detailed data structure of NAME1 which is a block for describing information in terms of 1-byte codes. NAME1 and NAME2 to be described later each comprise 8-byte units at an offset of a multiple of 8 bytes relative to the beginning of the track-information management file TRKLIST.MSF. The 8-byte unit is referred to as a slot. The beginning of NAME1 is slot 0x8000 used for describing a header. The beginning slot 0x8000 is followed by pointers and names. The last slot of NAME1 is used for describing the same data as the header.

BLK ID-NM1 (4 bytes)

This data is a constant NM1 of 0x4E4D2D31 identifying the contents of the block.

MCode (2 bytes)

This data is a code for identifying the manufacturer and the type of equipment.

PNM1-nnn and PNM1-S (OP) (4 bytes)

These pieces of data are each pointer pointing to a 1-byte code NM1. To be more specific, PNM1-S is a pointer pointing to a name representing the memory sheet 1. On the other hand, PNM1-nnn, where nnn=1 to 408, are each pointer pointing to the name of a piece of music.

Each of the pointers comprises a start position of 2 bytes in the block, the type of the character code occupying 2 bits and the size of data occupying 14 bits.

The start position is an offset relative to the beginning of the NM1 area. Expressed in terms of bytes, the start position has a value in the range 0x000 to 0x3989.

The type of the character code may have a value of 0 indicating the ASCII type, a value of 1 indicating 'ASCII+ tentative name' or a value of 2 indicating the corrected 8859-1 type.

The size of data which occupies 14 bits is the size of character data and an end byte of 0x00. This size has a value in the range 0x000 to 0x398C.

NM1-nnn (OP)

This data is variable-length information expressed in terms of 1-byte codes to represent the name of the memory sheet 1 or the name of a piece of music. The name is terminated by an end code of 0x00.

FIG. 16 is a diagram showing a detailed data structure of NAME2, that is, an area for describing information in terms of 2-byte codes.

The beginning of NAME2 is slot 0xC000 used for describing a header. The beginning slot 0xC000 is followed by pointers and names. The last slot of NAME2 is used for describing the same data as the header.

BLK ID-NM2 (4 bytes)

This data is a constant NM2 of 0x4E4D2D32 identifying the contents of the block.

MCode (2 bytes)

This data is a code for identifying the manufacturer and the type of equipment.

PNM2-nnn and PNM2-S (OP) (4 bytes)

These pieces of data are each pointer pointing to a 2-byte code NM2. To be more specific, PNM2-S is a pointer pointing to a name representing the memory sheet 1. On the other hand, PNM2-nnn, where nnn=1 to 408, are each pointer pointing to the name of a piece of music.

Each of the pointers comprises a start position of 2 bytes in the block, the type of the character code occupying 2 bits and the size of data occupying 14 bits.

The start position is an offset relative to the beginning of the NM2 area. Expressed in terms of bytes, the start position has a value in the range 0x000 to 0x3987.

The type of the character code may have a value of 0 indicating the Japanese language (MS-JIS), a value of 1 indicating the Korean language (KS C5601-1989) or a value of 2 indicating the Chinese language (GB2312-80).

The size of data which occupies 14 bits is the size of character data and 2 end bytes of 0x0000. This size has a value in the range 0x000 to 0x398C.

NM2-nnn (OP)

This data is variable-length information expressed in terms of 2-byte codes to represent the name of the memory sheet 1 or the name of a piece of music. The name is terminated by an end code of 0x0000.

4-5 Data Files A3Dnnnnn.MSA

Next, the structure of a data file A3Dnnnnn.MSA for storing ATRAC3 data is described.

Figure 17:
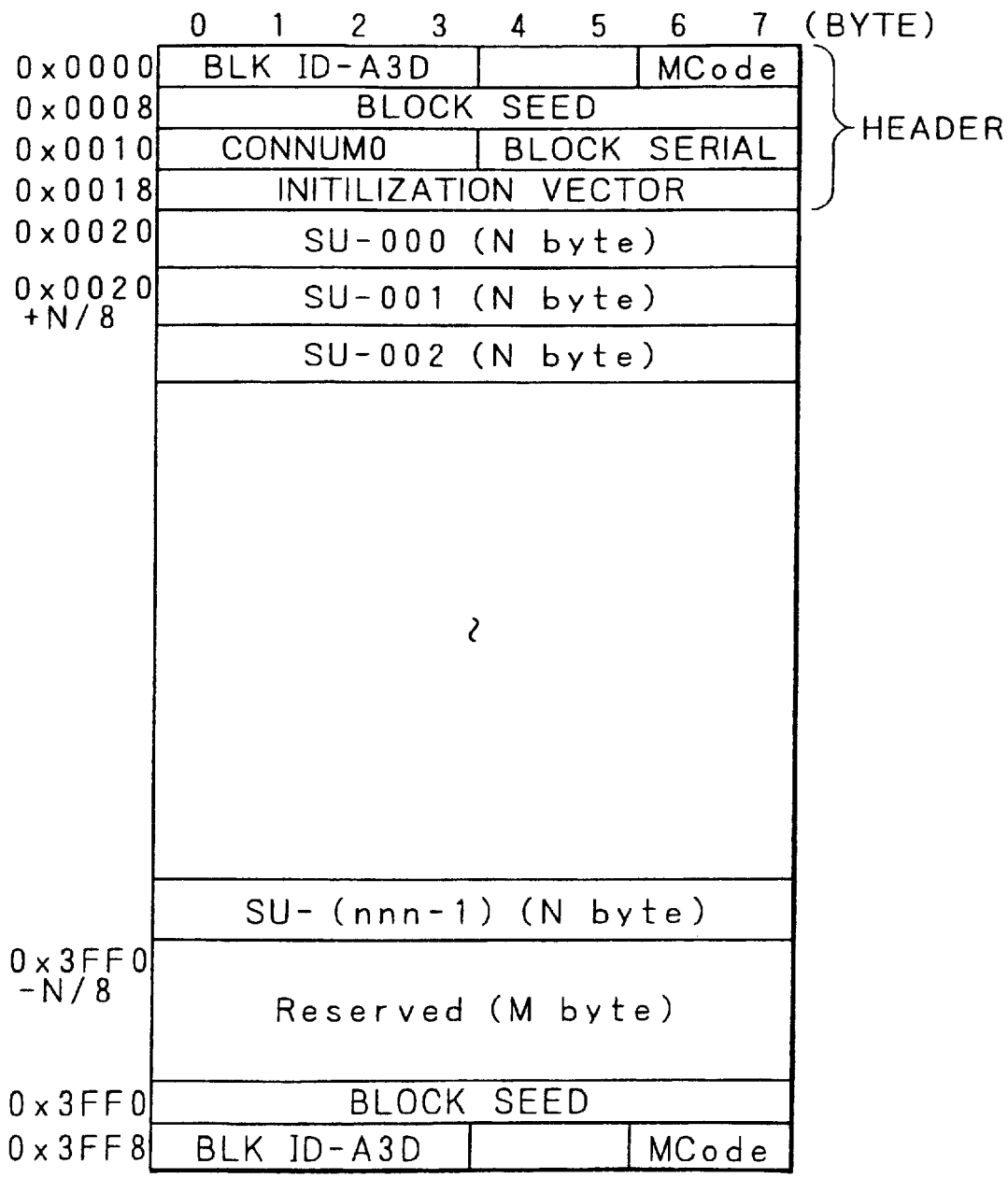
FIG. 17 is an explanatory diagram showing the data structure of a data file provided by the embodiment.

FIG. 17 is a diagram showing a block of an array of data stored in a data file A3Dnnnnn.MSA for an SU size of N bytes.

This file comprises slots each having a size of 8 bytes. The slots shown in FIG. 17 start at 0x0000 and end at 0x3FF8.

4 slots at the beginning of the file are a header which includes pieces of data described below. The second slot is BLOCK SEED. A slot immediately preceding the last slot is also BLOCK SEED. The last slot is BLK ID-A3 and MCode.

BLK ID-A3D (4 bytes)

This data is a constant A3D of 0x41324420 identifying the contents of the block.

MCode (2 bytes)

This data is a code for identifying the manufacturer and the type of equipment. If the file is edited, it is necessary to update this code.

BLOCK SEED (8 bytes)

This data is used for creating a block key required for encryption. A start value of the block seed is computed by the SAM (Security Application Module) 50 of the recording apparatus from a random number. The block seed of a next block is computed by incrementing the start value by 1. As a technique to handle an error, the same block seed is recorded in the second slot and a slot preceding the last slot. In addition, it is not necessary to update the block seed even if the data file is edited.

CONNUM (4 bytes)

This data is a content number obtained initially. This initial content number is initially the same as CONNUM of the track-information management file TRKLIST.MSF described earlier. It is not necessary to update the content number even if the data file is edited.

BLOCK SERIAL (4 bytes)

This data is the serial number of the block. The serial number of the first block is 0 and that of the following block is obtained by incrementing the number of the current block by 1. It is not necessary to update the serial number even if the data file is edited.

INITIALIZATION VECTOR (8 bytes)

This data is an initial value required for encryption and decryption of ATRAC3 data. At the beginning of a content, the initial value is 0. In the next block, the initial vector is equal to a last encrypted value of the last SU. It is not necessary to update the initial vector even if the data file is edited.

Such a head is followed by sound units SU-nnnn arranged sequentially. An SU is data obtained as a result of compression of 1,024 samples. The amount of data varies from mode to mode. It is not necessary to update the mount of data even if the data file is edited.

FIG. 18 is a table showing the amount of data, the number of SUs per block, the amount of margin data per block, the transfer rate and the transfer time of a data file for each mode.

In general, a memory sheet 1 having a size of 64 MB is used. Data for a CD mode of such a memory sheet 1 is explained. A memory sheet with a size of 64 MB has 3,968 blocks. In the CD mode, the size of 1 SU is 320 bytes. Thus, 1 block comprises 51 SUs which each correspond to (1,024/44,100) seconds. Therefore, the transfer time for the data file is:

(1,024/44100)×51×(3,968−16)=4,680 seconds×78 minutes. The transfer rate is:

(44100/1024)×320×8=110,250 bps.

4-6 Additional-Information File INFLIST.MSF

Next, the additional-information file INFLIST.MSF is explained.

Figures 19A, 19B:
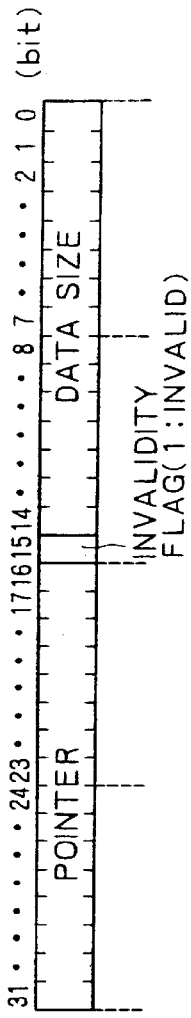
FIGS. 19A and 19B are explanatory diagrams in which 19A showing the data structure of an additional-information file provided by the embodiment and 19B showing the index pointer of the additional-information file.

FIG. 19A is a diagram showing a detailed data structure of the additional-information file INFLIST.MSF.

Much like the track-information management file TRKLIST.MSF, the additional-information file INFLIST-.MSF comprises slots each having a size of 16 bytes.

Slot 0x0000, that is, a slot at the beginning of the additional-information file, is a header. The header is followed by pointers and pieces of data which are described after explanation of the header.

The header comprises the following pieces of data.

BLK ID-INF (4 bytes)

This data is a constant INF of 0x494E464F identifying the contents of the block.

T-DAT (2 bytes)

This data is the total number of pieces of data in the range 0 to 409.

MCode (2 bytes)

This data is a code for identifying the manufacturer and the type of equipment.

YMDhms (4 bytes)

This data is a recording date and a recording time.

INF-nnn (4 bytes)

This data is an index pointer pointing to units of additional information to be described later. The units of additional information pointed to by the index pointer have a variable length expressed in terms of slots (or 2-byte units).

Notations INF-001 to INF-409 denote the index pointers.

It should be noted that the index pointers INF-001 to INF-409 are each referred to as a first pointer provided by the present invention.

The index pointer INF-nnn with a length of 4 bytes has a configuration shown in FIG. 19B. To put it in detail, the 16 most significant bits are a pointer and the 15 least significant bits are a data size. 1 bit between the pointer and the data size is an invalidity flag.

What is pointed to by a pointer is the start position of a unit of additional information. A pointer expressed by the 16 most significant bits has a value in the range 0x0000 to 0xFFFF. A unit of additional information to be described later is described by using DataSlot-0000 to DataSlot-FFFF. The pointer is an offset relative to DataSlot-0000 located at a byte address of 0x8000. That is to say, the pointer points to a slot position at an offset relative to data-slot 0000 at 0x8000 or the offset is represented by the pointer. The data size is the total amount of data representing the additional information for the piece of music.

To be more specific, the data size described in the 15 least significant bits is the total number of slots. A unit of additional information thus starts from the beginning of a slot and ends at a position in a last slot for the information. The area between the position and the end of the last slot is filled up with 00.

The invalidity flag of an index pointer is identification information indicating whether the unit of additional information pointed to by the index pointer is valid or invalid. An invalidity flag of 0 indicates a valid unit of additional information and an invalidity flag of 1 indicates an invalid unit of additional information.

It should be noted that the first index pointer normally denoted by INF-409 points to the unit of additional information for the album as a whole.

As explained above, a unit of additional information including the substance of actual additional information is described in 1 data slot or a plurality of data slots 0000 to FFFF of the additional-information file with a slot used as a unit of description.

Figure 20:
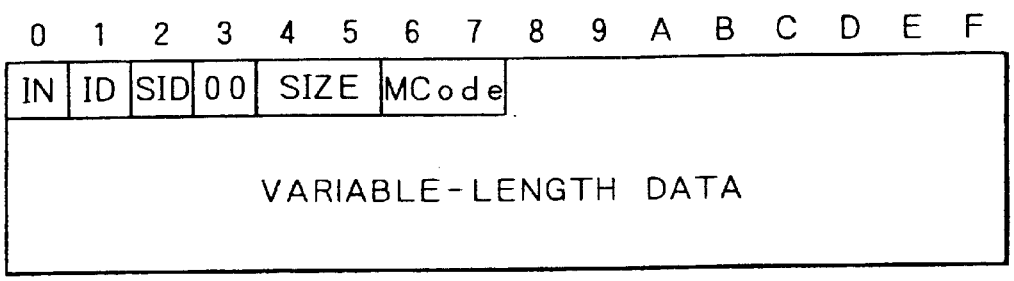
FIG. 20 is an explanatory diagram showing the data structure of an additional-information unit provided by the embodiment.

FIG. 20 is a diagram showing the data structure of a unit of additional information.

As shown in the figure, the unit of additional information includes a header of 8 bytes at the beginning of the unit.

IN (1 byte)

This data is a constant IN of 0x69.

ID (1 byte)

This information identifies the type of additional information. There are many types of additional information. This information is also referred to as a key ID to distinguish it from an SID (sub-ID) described below.

SID (1 byte)

A sub-ID which is T. B. D also represents a type.

SIZE (2 bytes)

This information is the number of slots representing the size of the unit of additional information indicated by the ID. The size of the unit has a value in the range 1 to 7FFF. The most significant bit MSB of the size is an invalidity flag. To be more specific, an MSB bit of 0 indicates a valid unit of additional information while an MSB bit of 1 indicates an invalid unit of additional information.

MCode (2 bytes)

This information is the recorded code of the equipment maker.

Such a header is followed by data having a variable length. The data is the substance of actual additional information.

FIG. 21 is a diagram showing typical additional information.

A SIZE value of 0x8xxx indicates that the data has been deleted or is invalid. The type of the additional information is indicated by the key ID and the SID described in the header. Details of these codes are not described since values of the key ID and the SID have not been defined yet.

Additional information includes a copyright code called an ISRC (International Standard Recording Code), musical information such as the names of a song writer and an artist and hardware control information. In the case of musical information, 2 bytes are added to the beginning of the data for indicating the character code of the musical information.

FIG. 22 is a diagram showing the data structure of a unit of additional information. Some examples of additional information are explained by referring to this data structure.

FIG. 23 is a diagram showing the data structure of additional information which is a time stamp. As shown in FIG. 21, the time stamp is a recording time stamp.

Data of the time stamp is stored in the YMDhms format. If the whole slot is not occupied by the time stamp, the remaining area is filled up with 00.

FIG. 24 is a diagram showing the data structure of additional information which is a playback log file. As shown in the figure, pieces of YMDhms data are logged where notation YMD stands for Year, Month and Day whereas notation hms is an abbreviation of hour, minute and second.

FIG. 25 is a diagram showing the data structure of additional information which comprises the name of an artist, an ISRC code and a TOCID. In this example, the name of the artist is described in a slot in terms of 1-byte codes. The remaining area in the slot is filled up with 00. The next slot is an ISRC code stored as data. The last slot is data of a TOC-ID. Assume that the additional information shown in FIG. 25 is deleted. In this case, the additional information shown in FIG. 25 turns into one shown in FIG. 26. To be more specific, SIZE is updated to 8xxxx.

5. File Recording Processing

The following description explains processing carried out by the drive apparatus 20 to record audio data and additional information into the memory sheet 1 having the configuration described above with reference to a flowchart shown in FIG. 27.

Figure 27:
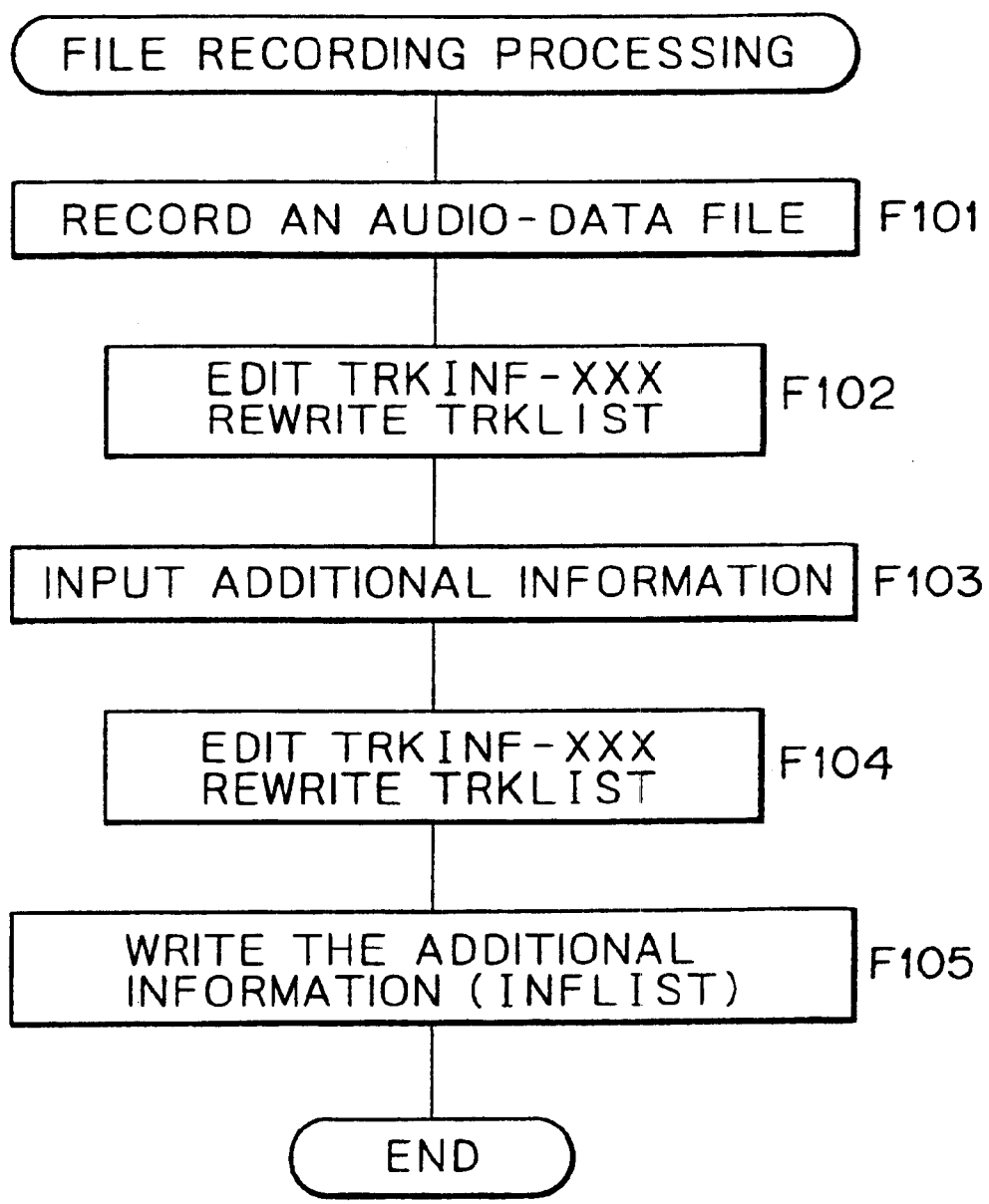
FIG. 27 shows a flowchart representing processing carried out by the drive apparatus provided by the embodiment to record a file.

As shown in FIG. 27, the flowchart begins with a step F101 at which the CPU 41 carries out processing to record an audio signal supplied to the drive apparatus 20 via the digital input terminal 27, the microphone input terminal 25, the line input terminal 26 or the USB connector 28 into the memory sheet 1 as a data file in accordance with a recording operation carried out by the user.

To put in detail, the CPU 41 drives each input system and components such as the DSP 49 to carry out necessary processing on the audio signal and stores the processed audio data into the RAM 41b.

The CPU 41 further carries out processing to authenticate the memory sheet 1 through the memory interface 42 by using the SAM 50. When the authentication processing is successfully finished, the audio data stored in the RAM 41b is encrypted and the result of the encryption is supplied to the memory sheet 1 to be recorded therein as 1 data file or a plurality of data files (tracks).

When the processing to record 1 data file or a plurality of data files described above is completed, the flow of the processing goes on to a step F102 at which the track-information management file TRKLIST.MSF is updated.

In order to update the track-information management file TRKLIST.MSF, the CPU 41 generates pieces of data to be stored in a track-information area TRKINF and a part-information area PRTINF on the RAM 41b for each of the data files recorded in the memory sheet 1, reconfiguring data of the track-information management file TRKLIST.MSF shown in FIG. 12. The reconfigured track-information management file TRKLIST.MSF is supplied to the memory sheet 1 in order to update the track-information management file TRKLIST.MSF already existing in the memory sheet 1.

Then, the flow of the processing goes on to a step F103 at which processing is carried out to input additional information to be associated with the data files recorded in the memory sheet 1 this time.

Examples of the additional information are the names of a piece of music and an artist entered by the user in an edit operation or various kinds of information supplied to the drive apparatus 20 along with the audio signal. Assume that the audio signal is digital data supplied to the drive apparatus 20 through the digital input terminal 27 or the USB connector 28. In this case, various kinds of information may be transmitted along with the audio signal. Additional information can then be generated on the basis of the transmitted information.

When additional information is received from the user or an external apparatus as described above, the CPU 41 generates a new additional-information file INFLIST.MSF or updates the existing additional-information file INFLIST.MSF including the additional information as a unit of additional information in the RAM 41b. It is needless to say that, at that time, an index pointer INF-nnn shown in FIG. 19 for the unit of additional information is also set.

After the additional-information file INFLIST.MSF is generated, the flow of the processing goes on to a step F104 at which the CPU 41 updates the track-information management file TRKLIST.MSF for the additional-information file INFLIST.MSF. In this case, in order to associate a unit of additional information in the additional-information file INFLIST.MSF pointed to by an index pointer with 1 or a plurality of recorded data files, pointers INF-nnn shown in FIG. 12B are set in the track-information areas TRKINF corresponding to the recorded data files.

The track-information management file TRKLIST.MSF reconfigured in this way is then supplied to the memory sheet 1 to update the track-information management file TRKLIST.MSF already existing in the memory sheet 1.

The flow of the processing then goes on to a step F105 at which the additional-information file INFLIST.MSF generated at the step F103 is supplied to the memory sheet 1 to record the additional-information file INFLIST.MSF in to the memory sheet 1 or to update the additional-information file INFLIST.MSF already existing in the memory sheet 1.

By recording data files of typically pieces of music, recording or updating an additional-information file INFLIST.MSF and recording or updating a track-information management file TRKLIST.MSF, 1 piece of music or a plurality of pieces of music can be each recorded as one of the data files and controlled properly. In addition, accompanying additional information can also be recorded.

It is also obvious from the above explanation that additional information or, strictly speaking, units of additional information each associated with a data file are controlled as follows. A unit of additional information is pointed to by an index pointer INF-nnn in the additional-information file INFLIST.MSF. In addition, the index pointer INF-nnn is pointed to by a pointer INFnnn in a track-information area TRKINF which is located in the track-information management file TRKLIST.MSF and associated with the data file.

Since additional information is controlled by pointers organized in a 2-stage configuration as described above, later processing to edit the additional information can be made very efficient.

For example, various kinds of edit processing can be carried out by merely updating the track-information management file TRKLIST.MSF having a small size without the need to update the additional-information file INFLIST.MSF which has a large size. In addition, special control can also be executed by updating the track-information management file TRKLIST.MSF. Examples of the special control are transferring additional information from a data file to another and associating a plurality of data files with a piece of additional information.

It should be noted that additional information for the entire memory sheet is recorded independently of processing to record a data file.

When the user enters additional information for the entire memory sheet, the pieces of processing of the steps F103 to F105 of the flowchart shown in FIG. 27 are carried out. In this case, a pointer updated at that time is used as the pointer INF-S in the track-information management file TRKLIST-.MSF shown in FIG. 12A and, typically, the index pointer INF-409 among the index pointers shown in FIG. 19A is used as an index pointer in the additional-information file INFLIST.MSF.

As described above, additional information for a data file is recorded along with the data file. It should be noted that additional information for an existing data file can of course be recorded as well. In this case, for the existing data file to be associated with the additional information, the pieces of processing of the steps F103 to F105 of the flowchart shown in FIG. 27 are carried out.

6. File Deletion Processing

Figure 28:
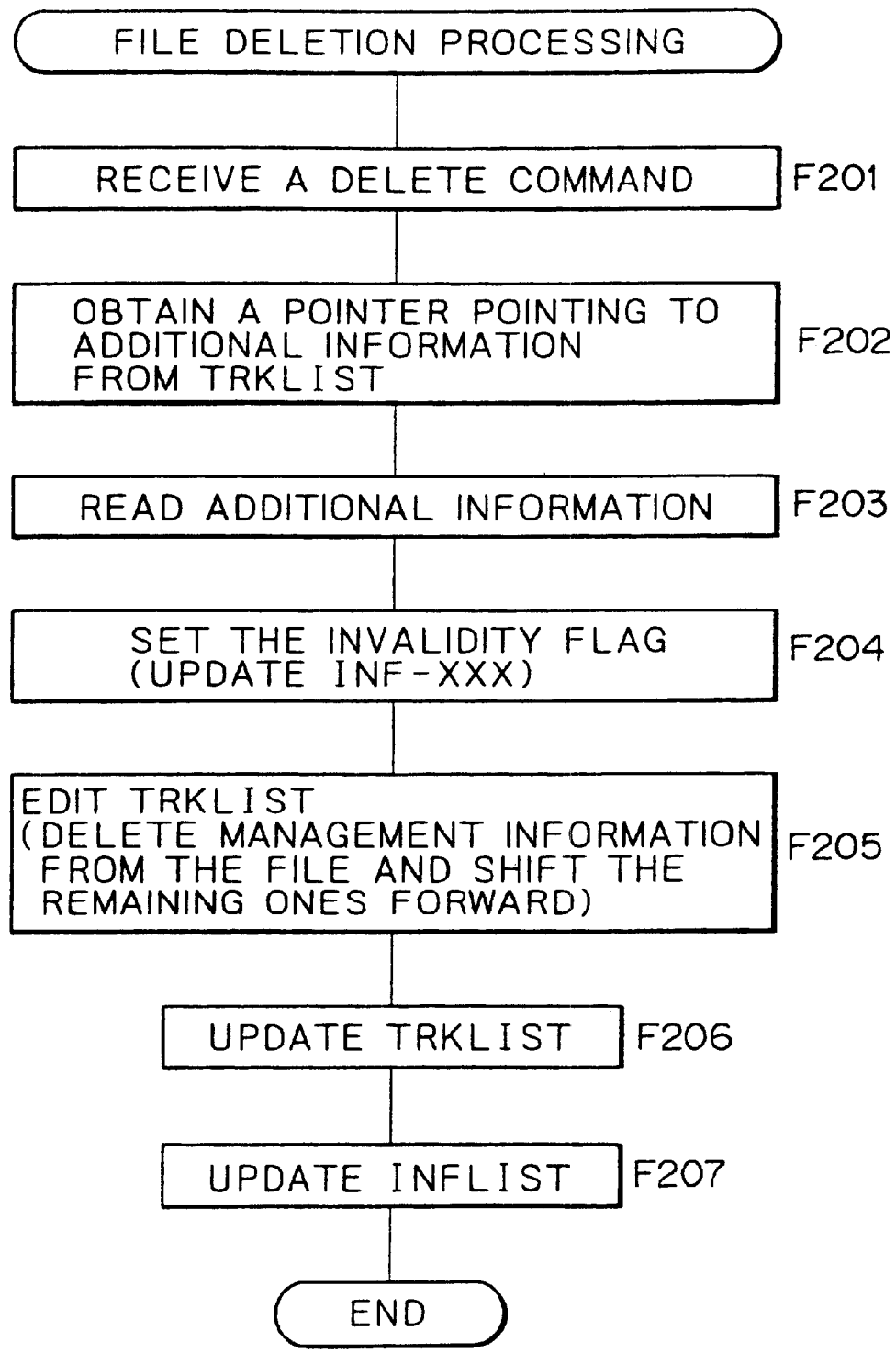
FIG. 28 shows a flowchart representing processing carried out by the drive apparatus provided by the embodiment to delete a file.

The following description explains processing to delete a data file and additional information associated with the data file by referring to a flowchart shown in FIG. 28.

As shown in FIG. 28, the processing begins with a step F201 at which the CPU 41 receives a deletion command when the user specifies a recorded data file and carries out an operation to delete the specified data file. At the next step F202, a pointer INF-nnn in a track-information area for the data file to be deleted is read out from the track-information management file TRKLIST.MSF of the memory sheet 1 which was loaded previously in the RAM 41b.

At the next step F203, the additional-information file INFLIST.MSF is read out from the memory sheet 1. At the next step F204, an index pointer INF-nnn in the additional-information file INFLIST.MSF pointed to by the index pointer INF-nnn read out at the step F202 is updated to contents with the invalidity flag turned on, that is, with the invalidity flag set at '1' as shown in FIG. 19B.

At the next step F205, the CPU 41 updates the track-information management file TRKLIST.MSF. To be more specific, the track-information area TRLINF-xxx and the part-information area PRTINF-xxx for the data file to be erased are deleted. In this way, the deletion of the data file is implemented.

By deleting the track-information area TRLINF-xxx and the part-information area PRTINF-xxx, the areas allocated to the track-information area TRLINF-xxx and the part-information area PRTINF-xxx become a free area in the track-information management file TRKLIST.MSF. Pieces of data stored in track-information areas TRLINF-xxx and part-information areas PRTINF-xxx for other data files following the free area need to be shifted forward.

After the track-information management file TRKLIST-.MSF is reconstructed as described above, at the next step F206, the reconstructed track-information management file TRKLIST.MSF is supplied to the memory sheet 1 to update the track-information management file TRKLIST.MSF already existing in the memory sheet 1.

Subsequently, at the next step F207, the additional-information file INFLIST.MSF updated at the step F204, that is, the additional-information file INFLIST.MSF with the invalidity flag thereof turned on at the step F204, is supplied to the memory sheet 1 to update the additional-information file INFLIST.MSF already existing in the memory sheet 1.

The processing to delete a data file is ended with the processing carried out at the step F207.

In the processing described above, deletion of a data file itself is implemented by merely updating the track-information management file TRKLIST.MSF. In addition, since the track-information management file TRKLIST.MSF is a file with a relatively small size, the deletion of a data file and reconstruction of data accompanying the deletion are not such a heavy processing load.

Additional information associated with a deleted data file is erased by merely turning on the invalidity flag in the associated index pointer in the additional-information file INFLIST.MSF.

The size of the additional-information file INFLIST.MSF increases with the amount of additional information stored therein. In the deletion processing, however, it is not necessary to reconstruct the whole additional-information file INFLIST.MSF. Instead, only an associated index pointer needs to be updated. That is to say, the unit of additional information itself is not manipulated. Thus, the processing load does not increase.

It is thus obvious from the above description that the processing to delete a data file and additional information associated with the data file can be carried out by a portable and compact drive apparatus 20 such as the one implemented by the embodiment, that is, an apparatus in which a high processing power can not be provided. In other words, the management system of additional information in the memory sheet 1 allows an apparatus with a small processing power to carry out editing work without problems.

It should be noted that there is conceived a case in which additional information for the entire memory sheet 1 is deleted. In this case, the data-file deletion processing represented by the flowchart shown in FIG. 28 is carried out specially for the entire memory sheet 1. To be more specific, at the step F202, it is from the pointer INF-S which is in the header of the track-information management file TRKLIST-.MSF that the index pointer is obtained. It is needless to say that the pieces of processing carried out at the steps F205 and F206 to update the track-information management file TRKLIST.MSF as part of deletion of a data file are not required in this case.

In addition, additional information associated with an individual data file can be deleted independently of the data file. That is to say, additional information associated with a data file can be deleted even though the data file itself is not. In this case, it is not necessary to carry out the pieces of processing at the steps F205 and F206 to update the track-information management file TRKLIST.MSF which are normally performed as part of deletion of a data file.

7. Processing to Compress the Additional-Information File

After additional information is deleted by setting an invalidity flag as described above, the additional-information file can be reconstructed or compressed by using an apparatus having a high data processing power such as the personal computer 11 and a drive apparatus of a stationary type compatible with the memory sheet 1.

With the drive apparatus 20 having a not-so-high processing power as described above, the unit of additional information itself, that is, the substance of additional information itself, is not actually erased. As a result, a wastefully used area is left in the additional-information file INFLST-.MSF itself.

Of course, such a wastefully used area can be left in the additional-information file INFLST.MSF as it is. However, it is desirable to compress the additional-information file INFLST.MSF for the memory sheet 1 by removal of the wastefully used area from the additional-information file INFLST.MSF typically by means of the personal computer 11.

Figure 29:
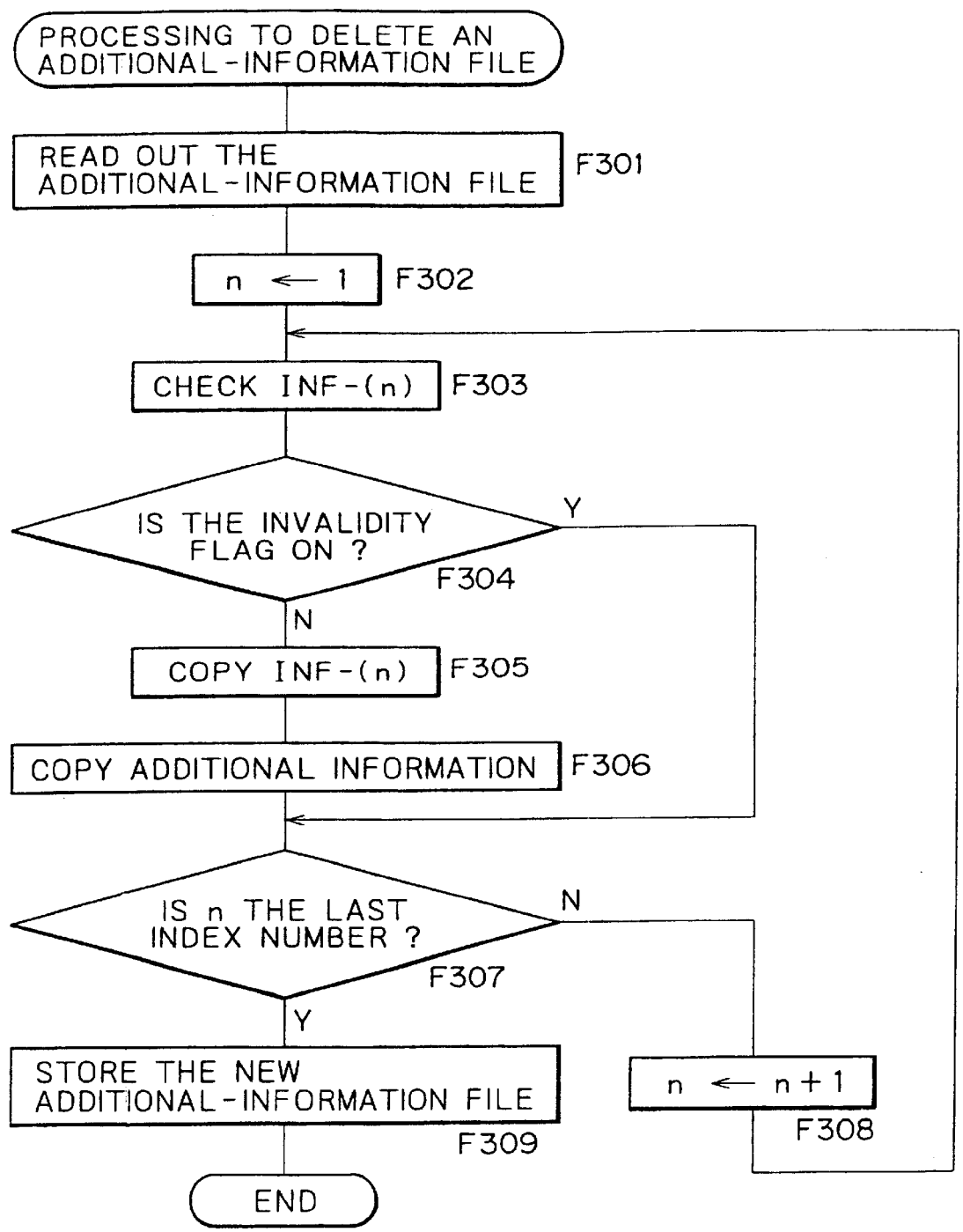
FIG. 29 shows a flowchart representing file compression processing provided by the embodiment.

The following description explains processing to compress the additional-information file INFLST.MSF by utilizing the processing power of typically the personal computer 11 or a stationary drive apparatus by referring to a flowchart shown in FIG. 29.

FIG. 29 shows a flowchart representing the processing which is carried out by a CPU of a data processing apparatus with a high processing power such as the personal computer 11 or a stationary drive apparatus.

For example, a stationary drive apparatus is explained as a data processing apparatus having a high processing power. It should be noted that the configuration of such a data processing apparatus having a high processing power is the same as that of the drive apparatus 20 shown in FIG. 3 except that the data processing apparatus having a high processing power can be considered to be an apparatus with a CPU 41 having a high performance. For this reason, the configuration of such a data processing apparatus or the stationary drive apparatus for carrying out the processing represented by the flowchart shown in FIG. 29 is not explained. In the description of the processing, the central processing unit having a high performance is denoted by a CPU 41H in order to distinguish it from the CPU 41 shown in FIG. 3.

By the same token, the other blocks are each denoted by a notation with the suffix H.

As shown in FIG. 29, the flowchart representing the processing to compress the additional-information file INFLIST.MSF begins with a step F301 when the user issues a request for such processing with the memory sheet 1 mounted on the mounting/dismounting mechanism 22H employed in the data processing apparatus capable of carrying out the processing. It should be noted that the processing can also be carried out automatically at a point of time the memory sheet 1 is mounted.

First of all, at the step F301, the CPU 41H reads out the additional-information file INFLIST.MSF from the memory sheet 1 through the memory interface 42H and loads the file in the RAM 41bH.

Then, at the next step F302, a variable n is set at 1 before going on to pieces of processing of a step F303 and the subsequent steps.

At the next step F303, the index pointer INF-(n) is read out from the additional-information file INFLIST.MSF. At the next step F304, the index pointer INF (n) is examined to form a judgment as to whether or not the invalidity flag included therein is turned on or off.

If the invalidity flag is found turned on, the flow of the processing goes on to a step F307 at which the variable n is examined to form a judgment whether the unit of additional information pointed to by the last index pointer INF-(n) has been processed. If the unit of additional information pointed to by the last index pointer INF-(n) has not been processed, the flow of the processing goes on to a step F308 at which the variable n is incremented by 1. Then, the flow of the processing goes back to the step F303.

If the outcome of the judgment formed at the step F304 indicates that the invalidity flag is turned off, on the other hand, the flow of the processing goes on to a step F305 at which the subsequent index pointers INF-(n) are shifted upward. Then, at the next step F306, the units of additional information pointed by the shifted index pointers INF-(n) are also shifted upward as well. Subsequently, the flow of the processing goes on to the step F307. If the outcome of the judgment formed at the step F307 indicates that the unit of additional information pointed to by the last index pointer INF-(n) has not been processed, the flow of the processing goes on to the step F308 at which the variable n is incremented by 1. Then, the flow of the processing goes back to the step F303. The pieces of processing are carried out at the steps F303 to F306 repeatedly and the variable n is incremented by 1 in each iteration till the most recent last unit of additional information is shifted upward at the step F306. With the most recent valid last unit of additional information shifted upward at the step F306, the outcome of the judgment formed at the step F307 will sooner or later indicate that the unit of additional information pointed to by the last index pointer INF-(n) has been processed.

The compression processing results in a new compressed additional-information file INFLIST.MSF like one shown in FIGS. 30A and 30B.

FIG. 30A is a diagram showing a typical additional-information file INFLIST.MSF obtained at the step F301. As shown in the figure, index pointers INF-001 to INF-005 point to additional-information units INFdata-001 to INFdata-005 respectively.

Assume that, as a result of the deletion processing represented by the flowchart shown in FIG. 28, the invalidity flags of the index pointers INF-002 and INF-004 are set to indicate that the additional-information units INFdata-002 and INFdata-004 have been deleted.

In the compression represented by the flowchart shown in FIG. 29, the invalidity flags of the index pointers INF-001 to INF-005 are examined sequentially one after another by incrementing the variable n in the loop comprising the steps F303 to F308. If a set invalidity flag is found, the subsequent index pointers INF-(n) and the units of additional information pointed by the subsequent index pointers INF-(n) are shifted upward to create a new additional-information file INFLIST.MSF shown in FIG. 30B. As shown in this figure, the valid index pointers INF-001, INF-003 and INF-005 as well as the additional-information unit INFdata-001, the additional-information unit INFdata-003 and the additional-information unit INFdata-005 pointed to by the valid index pointers INF-001, INF-003 and INF-005 respectively are left in the new additional-information file INFLIST.MSF. The valid index pointers INF-001, INF-003 and INF-005 are left in the new additional-information file INFLIST.MSF shown in FIG. 30B as the index pointer INF-001 and new index pointers INF-002 and INF-003 respectively whereas the additional-information unit INFdata-001, the additional-information unit INFdata-003 and the additional-information unit INFdata-005 are left in the new additional-information file INFLIST.MSF as the additional-information unit INFdata-001, a new additional-information unit INFdata-002 and a new additional-information unit INFdata-003 respectively.

As the outcome of the judgment formed at the step F307 indicates that the unit of additional information pointed to by the last index pointer INF-(n) has been processed, the processing represented by the flowchart shown in FIG. 29 to compress the additional-information file INFLIST.MSF is finished. In this case, the flow of the processing goes on to a step F309, departing from the loop comprising the steps F303 to F308. In the case of the example shown in FIGS. 30A and 30B, the flow of the processing goes on to the step F309 after the index pointer INF-005 pointing to the additional-information unit INFdata-005 has been processed.

At the step F309, the CPU 41H supplies the new additional-information file INFLIST.MSF created as described above to the memory sheet 1 to update the additional-information file INFLIST.MSF already existing in the memory sheet 1.

When the additional-information file INFLIST.MSF is updated, the processing to compress the additional-information file INFLIST.MSF is completed. As is obvious from FIGS. 30A and 30B, the additional-information file INFLIST.MSF does not include any index pointer INF-(n) with the invalidity flag thereof turned on and an additional-information unit INFdata-(n) pointed to by the index pointer INF-(n), containing condensed data of a smaller amount.

By carrying out the compression processing described above, the additional-information file INFLIST.MSF can be reconstructed into an optimally condensed data structure. The compression processing described above supports the function to delete additional information by merely setting an invalidity flag. That is to say, a wastefully used area in the additional-information file INFLIST.MSF obtained as a result of the processing represented by the flowchart shown in FIG. 28 can be eliminated.

It should be noted that, in the case of compression processing carried out by the personal computer 11, the drive apparatus 20 transfers the additional-information file INFLIST.MSF to be compressed to the personal computer 11 which carries out the processing represented by the flowchart shown in FIG. 29 on the additional-information file INFLIST.MSF. Then, an additional-information file INFLIST.MSF newly created by the personal computer 11 is transferred back to the drive apparatus 20 to be stored in the memory sheet 1.

The present invention has been exemplified by an embodiment. It should be noted, however, that the scope of the present invention is not constrained by the embodiment. In particular, the detailed processing procedure of each operation described above can conceivably be changed to a variety of modified versions.

In addition, the recording medium referred to as the first recording medium in the system provided by the present invention is not limited to the sheet memory shown in FIG. 1. That is to say, the first recording medium can be a solid-state memory having a different external shape such as a memory chip, a memory card or a memory module. It is also needless to say that the memory device does not have to be the flash memory. A memory device of another type can also be employed. Furthermore, the present invention can also be applied to a system employing a disc-shaped recording medium such as a mini disc, a DVD (Digital Versatile Disc), a hard disc and a CD-R instead of a solid-state memory.

In the embodiment described above, additional information of an audio-data file for recording information such as a piece of music is explained. It should be noted that the audio-data file is no more than an example. That is to say, the additional information is not limited to a track or audio data stored in a file. For example, the present invention can also be applied to other files such as a moving-picture file, a still-picture file and a audio-data file in the same way.

As is obvious from the above explanation, the present invention has the following effects.

First of all, in the recording medium provided by the present invention, the additional-information file is used for recording 1 additional-information unit or a plurality of additional-information units each describing actual additional information and first pointers each pointing to one of the additional-information units, whereas the track-information management file is used for recording second pointers which each point to one of the first pointers and are associated with data files or the entire recording medium. That is to say, a plurality of first pointers stored in the additional-information file are used for controlling additional-information units each describing the substance of actual additional information by associating each of the units of additional information to one of the first pointers. On the other hand, the second pointers stored in the track-information management file are used for controlling the first pointers. In this way, since pieces of additional information for data files and the entire recording medium are controlled by pointers organized in a 2-stage configuration, various kinds of edit processing can be carried out by merely updating the track-information management file with a small size without the need to update the additional-information file having a relatively large size. As a result, there is exhibited an effect that the processing to edit additional information can be made very efficient.

In addition, each of the first pointers stored in the additional-information file includes validity information indicating whether a unit of additional information pointed to by the first pointer is valid or invalid. With such validity information, an actual unit of additional information can be deleted by merely updating the validity information included in a first pointer pointing to the unit of additional information. That is to say, there is exhibited an effect of an ability to implement deletion of additional information by very simple processing.

The data processing apparatus provided by the present invention records input additional information as a unit of additional information in the additional-information file into a recording medium in which additional information is controlled by a configuration of the first and second pointers as described above. In addition, when a unit of additional information is recorded, first and second pointers are also recorded so that the recorded unit of additional information is controlled as additional information on a data file or the entire recording medium. As a result, a recording medium with the management system described above can be implemented, allowing processing to edit additional information to be made very efficient.

The data processing apparatus provided by the present invention deletes a unit of additional information from the recording medium by updating validity information included in the first pointer which is stored in the additional information and points to the deleted unit of additional information to change the validity information to invalid status indicating that the unit of additional information pointed to by the first pointer including the validity information has been deleted. Therefore, the deletion of additional information is not such a heavy processing load.

The above feature means that the apparatus is provided with a sufficient function for editing additional information even if the apparatus is merely a portable and compact data processing apparatus for example.

The data processing apparatus provided by the present invention is capable of updating the additional-information file recorded on a recording medium by generating a new additional-information file including no invalidated units of additional information in accordance with validity information included in each first pointer in the current additional-information file. For example, while a data processing apparatus with a relatively high processing power such as a personal computer is actually capable of processing the entire additional-information file with a large size, such a data processing apparatus is merely used for reconstructing the additional-information file in accordance with validity information. As a result, there is exhibited an effect of an ability to update the additional-information file into a file with a data structure including no wastefully used area.

What is claimed is:

1. A recording medium for recording one of one main data and a plurality of main data and for recording one of one sub data and a plurality of sub data related respectively to said main data, said recording medium comprising:

a main data recording region for recording said one of one main data and a plurality of main data;

a sub data recording region for recording at least one sub data file comprising said one of one sub data and a plurality of sub data and sub management data for controlling recording locations of said sub data; and a management data recording region for recording link information for controlling said main data recorded in said main data recording region and linking said main data to said sub data file containing said sub data related to said main data.

2. The recording medium according to claim 1 wherein said sub data recording region includes information for each said sub data indicating whether said sub data is valid.

3. A method of recording data into a recording medium, in which the data include main data, management data for controlling said main data and sub data related to said main data, said method comprising the steps of:

recording said main data into said recording medium;

recording said management data based on the step of recording said main data;

recording a sub data file comprising said sub data into said recording medium; and updating said management data so as to record link information for linking said main data to said sub data file as one of said management data.

4. The method of recording data into a recording medium according to claim 3 wherein said sub data file comprises sub data and sub management data for controlling recording locations on the recording medium of said sub data.

5. The method of recording data into a recording medium according to claim 3, further including a step of executing encoding said main data before said step of recording said main data into said recording medium.

6. An editing method for carrying out editing work by deletion of an invalid sub data recorded on a recording medium used for recording main data, for recording management data for controlling said main data and for recording a sub data file having at least one of said sub data related to said main data and having sub management data for invalidating said sub data, wherein said sub data file is connected and linked to said management data, said editing method comprising:

a data reading step of reading out said management data from said recording medium;

a file reading step of reading out said sub data file from said recording medium in accordance with link information of said management data;

a deletion step of deleting management data associated with sub data invalidated by sub management data in said sub data file and for deleting said sub data from said sub data file when said sub data is determined to be invalid based on said sub management data in said sub data file; and a file writing step of writing back into said recording medium said sub data file with unnecessary information deleted therefrom at said deletion step.

7. The editing method according to claim 6 wherein: said sub management data includes validity information indicating whether sub data stored in said sub data file is valid; and at said deletion step, said validity information is examined to form a judgment as to whether there is sub data to be deleted.

8. The editing method according to claim 6 wherein, at said deletion step, unnecessary information is deleted by copying only management data associated with valid sub data and copying said valid sub data to a new sub data file.

9. An editing method for carrying out editing by deletion of sub data recorded on a recording medium used for recording main data, management data for controlling said main data and a sub data file having said sub data related to said main data and for recording sub management data for deleting said sub data wherein said sub data file is connected and linked to said management data, said editing method comprising:

a data reading step of reading out said management data from said recording medium;

a file reading step of reading out said sub data file from said recording medium in accordance with link information of said management data;

a rewriting step of rewriting a specific one of said sub management data associated with sub data specified to be deleted in said sub data file read out at said file reading step; and a file writing step of writing back in said recording medium said sub data file with said specific one of sub management data for unnecessary sub data rewritten at said rewriting step.

10. The editing method according to claim 9 wherein: said sub management data includes validity information indicating whether sub data stored in said sub data file is valid; and at said rewriting step, said specific one of sub management data is rewritten by setting said validity information at invalid status.

11. A recording apparatus for recording into a recording medium main data, for recording management data for controlling said main data and for recording a sub data file having sub data related to said main data and sub management data for controlling said sub data, said recording apparatus comprising:

recording means for recording said main data, said management data and said sub data file into said recording medium;

first updating means for updating said management data stored on said recording medium based on the recording of said main data into said recording medium;

sub data file generation means for generating sub management data for controlling said sub data and for creating a sub data file including at least said sub data and said sub management data; and second updating means for updating said management data so as to record link information associating said sub data file with said main data as one of said management data.

12. The recording apparatus according to claim 11, further comprising encoding means for encoding said main data before recording of said main data into said recording medium.

13. An editing apparatus for carrying out editing of data recorded on a recording medium by deletion of an invalid sub data recorded on the recording medium used for recording main data, used for recording management data for controlling said main data and used for recording a sub data file comprising at least one of said sub data, related to said main data and sub management data for controlling said sub data wherein said sub data file is connected and linked to said management data, said editing apparatus comprising:

reading means for reading out said data from said recording medium;

writing means for writing said data into said recording medium;

judgment means for forming a judgment as to whether there is an invalid one of sub data based on said sub management data in said sub data file read out from said recording medium by said reading means; and control means for controlling editing of said sub data file in case a result of said judgment formed by said judgment means indicates there is an invalid one of sub data by executing the steps of:

deleting management data associated with sub data invalidated by said sub management data in said sub data file;

deleting said sub data determined to be invalid from said sub data file; and controlling said writing means to write an edited sub data file into said recording medium.

14. The editing apparatus according to claim 13 wherein said sub management data includes at least validity information indicating whether sub data stored in said sub data is valid; and said judgment means forms a judgment as to whether there is sub data to be deleted based on said validity information.

15. The editing apparatus according to claim 14 wherein said control means deletes unnecessary data by copying only sub management data associated with valid sub data and said valid sub data to a newly created sub data file.

16. An editing apparatus for carrying out editing by deletion of sub data recorded on a recording medium used for recording main data, management data for controlling said main data and a sub data file having said sub data related to said main data and sub management data for controlling said sub data wherein said sub data file is connected and linked to said management data, said editing apparatus comprising:

access means for reading out and writing said main data from and into said recording medium; and control means for controlling said access means to execute the steps of:

rewriting a specific one of said sub management data associated with sub data specified to be deleted in said sub data file read out by said access means; and writing back said sub data file with said specific one of sub management data rewritten into said recording medium.

17. The editing apparatus according to claim 16 wherein said sub management data includes at least validity information indicating whether sub data stored in said sub data file is valid; and said control means rewrites said specific one of sub management data by setting said validity information at an invalid status.

\* \* \* \* \*